US012490473B2

(12) United States Patent
Tanaka et al.

(10) Patent No.: US 12,490,473 B2
(45) Date of Patent: Dec. 2, 2025

(54) OXIDE SEMICONDUCTOR THIN-FILM TRANSISTOR DEVICE AND METHOD OF MANUFACTURING THE SAME

(71) Applicant: Xiamen Tianma Display Technology Co., Ltd., Xiamen (CN)

(72) Inventors: Jun Tanaka, Kanagawa (JP); Kazushige Takechi, Kanagawa (JP); Kenji Sera, Kanagawa (JP)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 437 days.

(21) Appl. No.: 18/074,756

(22) Filed: Dec. 5, 2022

(65) Prior Publication Data

US 2023/0178655 A1    Jun. 8, 2023

(30) Foreign Application Priority Data

Dec. 8, 2021 (JP) .................................. 2021-199126
Aug. 30, 2022 (JP) .................................. 2022-136788

(51) Int. Cl.
| | | |
|---|---|---|
| H01L 21/42 | (2006.01) | |
| H01L 21/426 | (2006.01) | |
| H10D 30/67 | (2025.01) | |
| H10D 99/00 | (2025.01) | |
| H10K 59/12 | (2023.01) | |
| H10K 59/121 | (2023.01) | |

(52) U.S. Cl.
CPC ....... *H10D 30/6755* (2025.01); *H01L 21/426* (2013.01); *H10D 30/6713* (2025.01); *H10D 30/6734* (2025.01); *H10D 30/6757* (2025.01); *H10D 99/00* (2025.01); *H10K 59/1213* (2023.02)

(58) Field of Classification Search
CPC .......... H10D 30/6713; H10D 30/6734; H10D 30/6755; H10D 30/6757; H10D 99/00; H10D 30/6715; H10D 86/423; H10D 86/60; H10K 59/1213; H10K 59/125; H01L 21/426; H01L 21/42; H01L 21/423; H01L 21/425
USPC ......................................................... 257/43
See application file for complete search history.

(56) References Cited

U.S. PATENT DOCUMENTS

| | | | |
|---|---|---|---|
| 2014/0225104 A1* | 8/2014 | Yamazaki | .......... H10D 30/6755 257/43 |
| 2015/0206981 A1* | 7/2015 | Komachi | ........... H10D 30/6715 257/43 |
| 2016/0300954 A1 | 10/2016 | Sasaki | |
| 2019/0207033 A1 | 7/2019 | Yamazaki et al. | |
| 2020/0251505 A1 | 8/2020 | Watakabe et al. | |

\* cited by examiner

*Primary Examiner* — Monica D Harrison
(74) *Attorney, Agent, or Firm* — Sughrue Mion, PLLC

(57) ABSTRACT

An oxide semiconductor thin-film transistor device includes a gate electrode region, an oxide semiconductor region, a first source/drain electrode region, and a second source/drain electrode region. The oxide semiconductor region has a concentration distribution of an element capable of increasing resistance of an oxide semiconductor. The concentration distribution shows a first concentration at the centroid of a channel region overlapping the gate electrode region in a planar view. The concentration distribution shows a concentration higher than the first concentration in a vicinity of at least a part of a boundary defining an outer end of the channel region.

7 Claims, 17 Drawing Sheets

OXIDE SEMICONDUCTOR THIN-FILM TRANSISTOR DEVICE AND METHOD OF MANUFACTURING THE SAME

CROSS-REFERENCE TO RELATED APPLICATIONS

This non-provisional application claims priority under 35 U.S.C. § 119(a) on Patent Application No. 2021-199126 filed in Japan on Dec. 8, 2021 and Patent Application No. 2022-136788 filed in Japan on Aug. 30, 2022, the entire contents of which are hereby incorporated by reference.

BACKGROUND

This disclosure relates to an oxide semiconductor thin-film transistor device and a method of manufacturing the same.

Application of oxide semiconductor thin-film transistors (oxide semiconductor TFTs) is expanding from display devices to memories; higher resolution and higher density are expected to be demanded. The semiconductor layer of an oxide semiconductor TFT includes a channel region and source/drain regions sandwiching the channel region. To achieve higher resolution and density, smaller source/drain regions are demanded. The source/drain regions are low-resistive regions having a resistance lower than the resistance of the channel region.

SUMMARY

An aspect of this disclosure is an oxide semiconductor thin-film transistor device including: a gate electrode region; an oxide semiconductor region; a first source/drain electrode region; and a second source/drain electrode region. The oxide semiconductor region has a concentration distribution of an element capable of increasing resistance of an oxide semiconductor. The concentration distribution shows a first concentration at the centroid of a channel region overlapping the gate electrode region in a planar view. The concentration distribution shows a concentration higher than the first concentration in a vicinity of at least a part of a boundary defining an outer end of the channel region.

An aspect of this disclosure is a method of manufacturing an oxide semiconductor thin-film transistor device, the method including: producing an oxide semiconductor layer; producing a gate electrode region; implanting an element capable of increasing resistance of an oxide semiconductor into a selected region of the oxide semiconductor layer; and producing a first source/drain electrode and a second source/drain electrode.

It is to be understood that both the foregoing general description and the following detailed description are exemplary and explanatory and are not restrictive of this disclosure.

EMBODIMENTS

Figure 1:
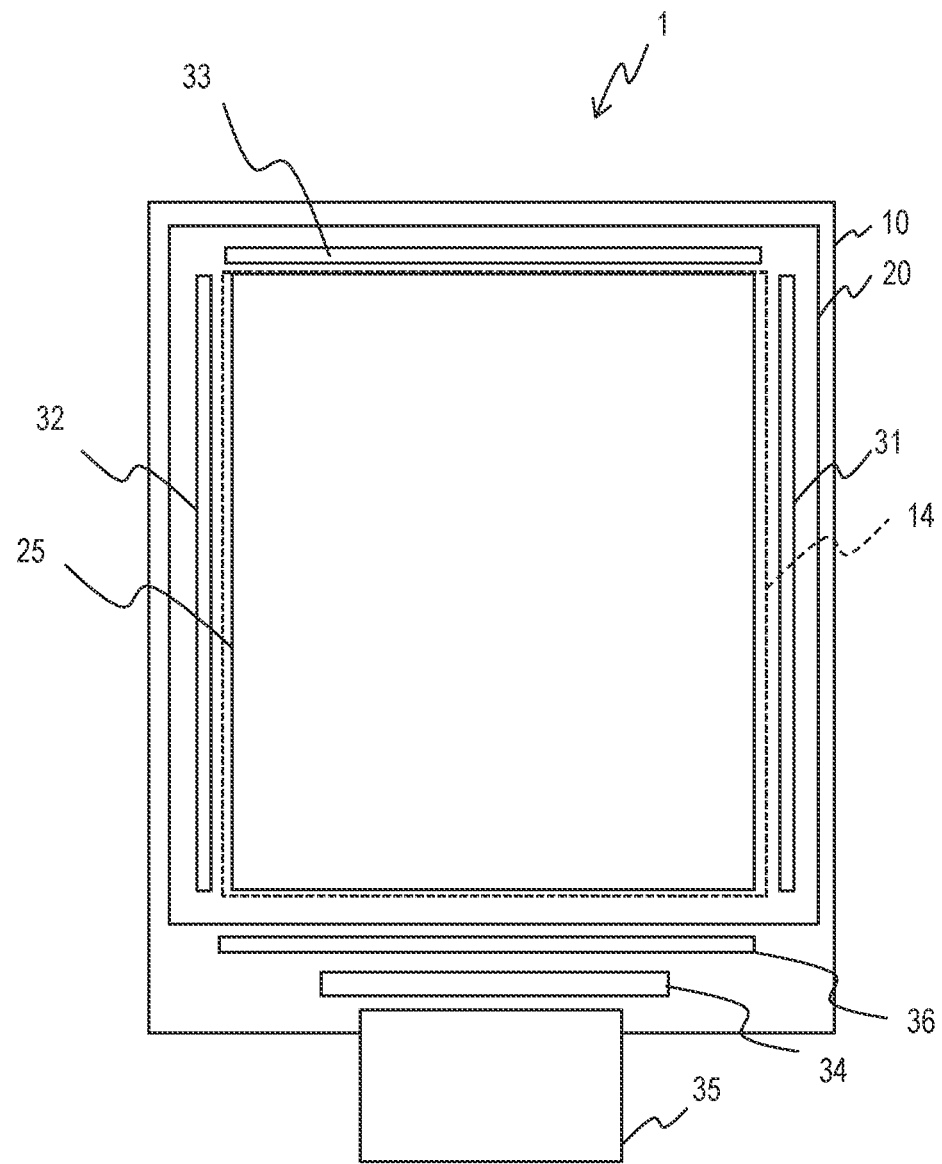
FIG. 1 schematically illustrates a configuration example of an OLED display device.

Hereinafter, embodiments of this disclosure will be described with reference to the accompanying drawings. It should be noted that the embodiments are merely examples to implement this disclosure and are not to limit the technical scope of this disclosure. Some elements in the drawings are exaggerated in size or shape for clear understanding of the description.

Overview

The following description employs an organic light-emitting diode (OLED) display device as an example of a device (oxide semiconductor TFT device) including oxide semiconductor thin-film transistors (oxide semiconductor TFTs). The OLED display device in this disclosure includes an oxide semiconductor TFT in a pixel circuit and/or a peripheral circuit. An example of the oxide semiconductor is indium gallium zinc oxide (IGZO). Oxide semiconductor thin-film transistors can be included in not only an OLED display device but also a flat panel display such as a liquid crystal display device or an electronic device such as a memory device or a high-voltage device.

An oxide semiconductor TFT generates small leakage current and accordingly, it can be used as a switching transistor connected to a storage capacitor (capacitive element) for maintaining a gate potential of a driving transistor in a pixel circuit, for example. The configurations disclosed herein are applicable to devices other than display devices.

The oxide semiconductor region of an oxide semiconductor TFT includes a channel region that controls the flow of carriers with the gate potential and source/drain regions sandwiching the channel region. The source/drain regions are low-resistive regions having a resistance lower than the resistance of the channel region.

For an oxide semiconductor TFT to show intended characteristics, it is important that the channel region have a configuration as designed. Increasing the density of oxide semiconductor TFTs requires their channel regions and source/drain regions to be smaller. For this reason, it is strongly demanded that the channel region have a designed resistance in the designed channel length and channel width.

A source/drain region can be reduced in resistance by some ways. For example, an oxide semiconductor can be reduced in resistance by being contacted by a source/drain electrode. Specifically, the metal composing the source/drain electrode extracts oxygen from the oxide semiconductor to increase oxygen vacancies in the oxide semiconductor and as a result, the oxide semiconductor is reduced in resistance. The oxide semiconductor can also be reduced in resistance by hydrogen diffusion from an insulating film around the oxide semiconductor, plasma treatment, or impurity ion implantation.

The region designed to become a channel region can be affected by reducing the resistance. Especially, the periphery (the vicinity of the outer end) of the designed channel region is more likely to reduce in resistance. If the low-resistive region of the oxide semiconductor expands into the designed channel region, the oxide semiconductor TFT may not work as designed.

However, providing a large interval between a source/drain electrode and the gate electrode to prevent reduction in resistance of the vicinity of a channel end defining the channel length hampers increasing the density of oxide semiconductor TFTs. If the resistance of the vicinity of a channel end defining the channel width is lowered, the oxide semiconductor TFT may exhibit a hump characteristic.

An embodiment of this specification implants an element that can increase the resistance of the oxide semiconductor to a selected region of the oxide semiconductor. This process saves the vicinity of the channel end from reducing in resistance.

Configuration of Display Device

FIG. 1 schematically illustrates a configuration example of an OLED display device 1. The OLED display device 1 includes a thin-film transistor (TFT) substrate 10 on which organic light-emitting elements (OLED elements) and pixel circuits are fabricated, a thin-film encapsulation (TFE) 20 for encapsulating the organic light-emitting elements. The thin-film encapsulation 20 is a kind of structural encapsulation unit. Another example of a structural encapsulation unit is an encapsulation substrate for encapsulating organic light-emitting elements and a bond (glass frit sealer) for bonding the TFT substrate 10 with the encapsulation substrate. The space between the TFT substrate 10 and the encapsulation substrate is filled with dry nitrogen or dry air, for example.

In the periphery of a cathode electrode region 14 outer than the display region 25 of the TFT substrate 10, a scanning driver 31, an emission driver 32, a protection circuit 33, a driver IC 34, and a demultiplexer 36 are provided. The driver IC 34 is connected to the external devices via flexible printed circuits (FPC) 35. The scanning driver 31, the emission driver 32, and the protection circuit 33 are peripheral circuits fabricated on the TFT substrate 10.

The scanning driver 31 drives scanning lines on the TFT substrate 10. The emission driver 32 drives emission control lines to control the light emission periods of pixels. The driver IC 34 is mounted with an anisotropic conductive film (ACF), for example.

The protection circuit 33 protects the elements in the pixel circuits from electrostatic discharge. The driver IC 34 provides power and timing signals (control signals) to the scanning driver 31 and the emission driver 32 and further, provides power and a data signal to the demultiplexer 36.

The demultiplexer 36 outputs output of one pin of the driver IC 34 to d data lines in series (d is an integer larger than 1). The demultiplexer 36 changes the data line to output the data signal from the driver IC 34 d times per scanning period to drive d times as many data lines as output pins of the driver IC 34.

Configuration of Pixel Circuit

Figure 2:
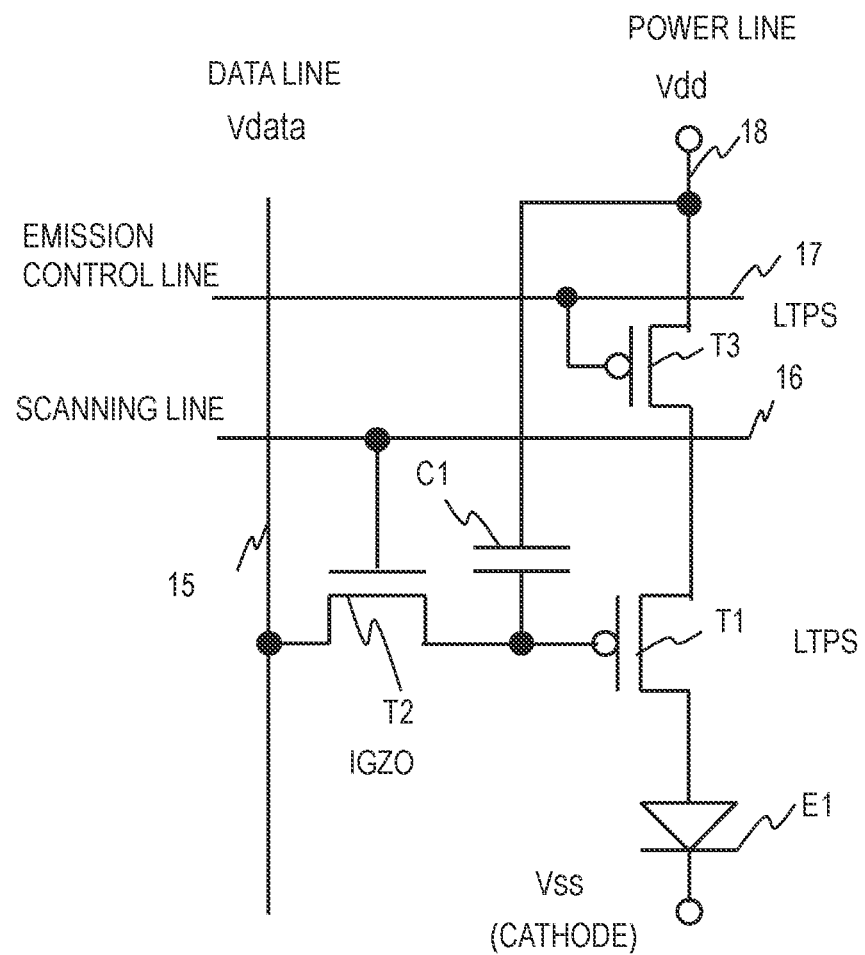
FIG. 2 illustrates a configuration example of a pixel circuit.

A plurality of pixel circuits are fabricated on the TFT substrate 10 to control electric current to be supplied to the anode electrodes of subpixels (also simply referred to as pixels). FIG. 2 illustrates a configuration example of a pixel circuit. Each pixel circuit includes a driving transistor T1, a selection transistor T2, an emission transistor T3, and a storage capacitor C1. The pixel circuit controls light emission of an OLED element E1. The transistors are TFTs. The transistors except for the driving transistor T1 are switching transistors.

The selection transistor T2 is a switch for selecting the subpixel. The selection transistor T2 is an n-channel type of oxide semiconductor TFT and its gate terminal is connected to a scanning line 16. The source terminal is connected to a data line 15. The drain terminal is connected to the gate terminal of the driving transistor T1.

The driving transistor T1 is a transistor (driving TFT) for driving the OLED element E1. The driving transistor T1 is a p-channel type of low-temperature polysilicon TFT and its gate terminal is connected to the drain terminal of the selection transistor T2. The source terminal of the driving transistor T1 is connected to the drain terminal of the emission transistor T3 and the drain terminal of the driving transistor T1 is connected to the OLED element E1. The storage capacitor C1 is provided between the gate terminal of the driving transistor T1 and a power line 18.

The emission transistor T3 is a switch for controlling supply/stop of the driving current to the OLED element E1. The emission transistor T3 is a p-channel type of low-temperature polysilicon TFT and its gate terminal is connected to an emission control line 17. The source terminal of the emission transistor T3 is connected to the power line 18 and the drain terminal of the emission transistor T3 is connected to the source terminal of the driving transistor T1.

Next, operation of the pixel circuit is described. The scanning driver 31 outputs a selection pulse to the scanning line 16 to turn on the selection transistor T2. The data voltage supplied from the driver IC 34 through the data line 15 is stored to the storage capacitor C1. The storage capacitor C1 holds the stored voltage throughout the period of one frame. The conductance of the driving transistor T1 changes in an analog manner in accordance with the stored voltage, so that the driving transistor T1 supplies a forward bias current corresponding to a light emission level to the OLED element E1.

The emission transistor T3 is located on the supply path of the driving current. The emission driver 32 outputs a control signal to the emission control line 17 to control ON/OFF of the emission transistor T3. When the emission transistor T3 is ON, the driving current is supplied to the OLED element E1. When the emission transistor T3 is OFF, this supply is stopped. The lighting period (duty ratio) in the period of one frame can be controlled by controlling ON/OFF of the transistor T3. The circuit configuration in FIG. 2 is merely an example; the pixel circuit can have a different configuration.

Configuration of TFT Substrate

Hereinafter, a configuration example of a TFT substrate including low-temperature polysilicon TFTs and oxide semiconductor TFTs is described. The oxide semiconductor can be IGZO. The configuration described in this specification is applicable to TFT substrates including TFTs of other kinds of oxide semiconductors.

Figure 3:
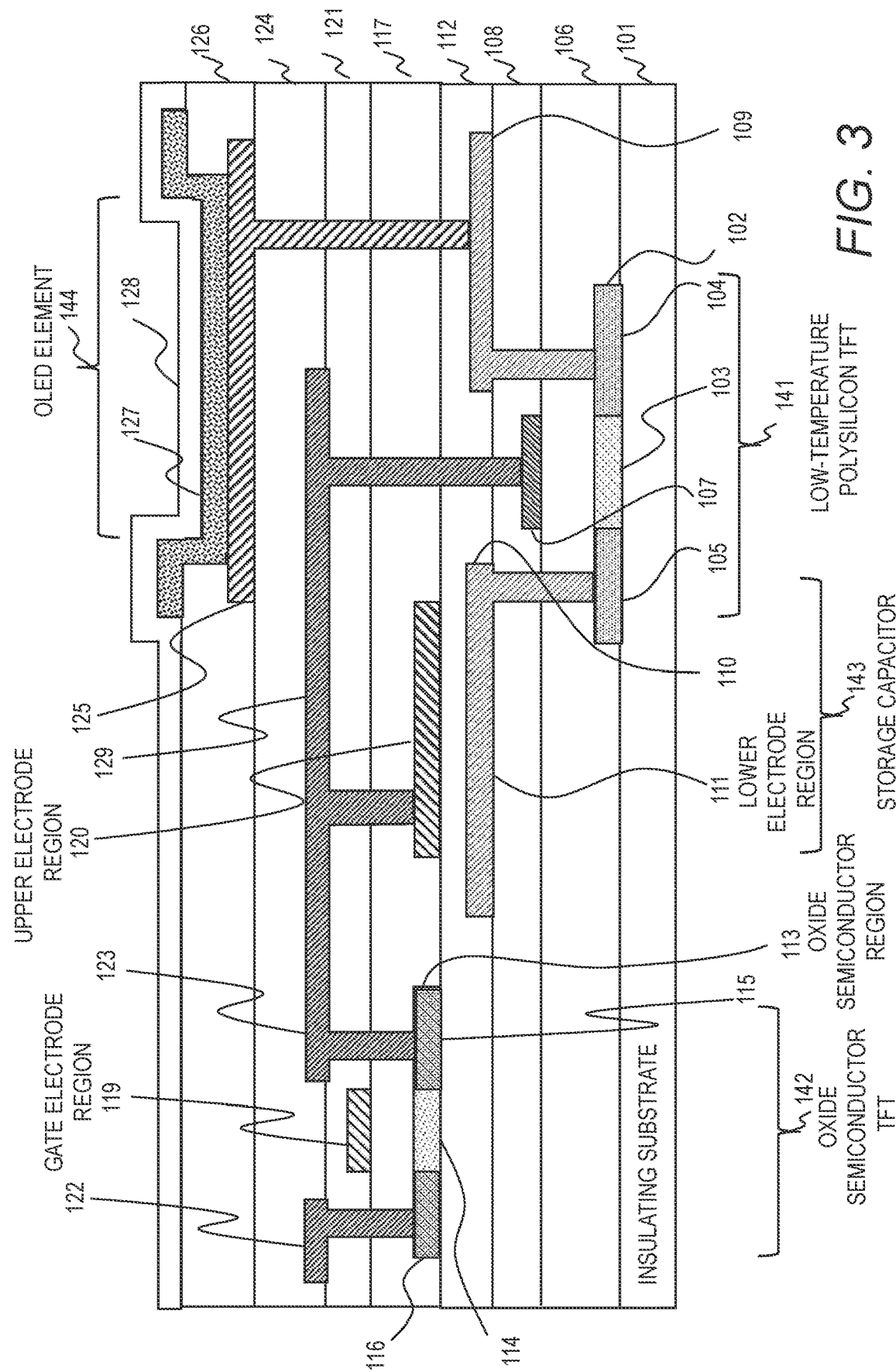
FIG. 3 schematically illustrates a cross-sectional structure of a part of a TFT substrate.

FIG. 3 schematically illustrates a cross-sectional structure of a part of a TFT substrate. A low-temperature polysilicon TFT 141, an oxide semiconductor TFT 142, a storage capacitor 143, and an OLED element 144 are fabricated on an insulating substrate 101. These elements correspond to the driving transistor T1, the selection transistor T2, the storage capacitor C1, and the OLED element E1 in FIG. 2.

The insulating substrate 101 is a flexible or inflexible substrate made of resin or glass. The low-temperature polysilicon TFT 141 includes a low-temperature polysilicon region 102. The low-temperature polysilicon region 102 is included in a low-temperature polysilicon layer and can be one island-like low-temperature polysilicon film or a part of a larger low-temperature polysilicon film. The low-temperature polysilicon region 102 includes source/drain regions 104 and 105 and a channel region 103 sandwiched between the source/drain regions 104 and 105 in an in-plane direction.

The source/drain regions 104 and 105 are made of low-temperature polysilicon reduced in resistance by being doped with high-concentration impurities; they are connected to source/drain electrode regions 109 and 110. The channel region 103 is made of low-temperature polysilicon not reduced in resistance (highly-resistive low-temperature polysilicon).

The low-temperature polysilicon region 102 is included in a low-temperature polysilicon layer. The low-temperature polysilicon layer includes the low-temperature polysilicon regions of low-temperature polysilicon TFTs in a plurality of pixel circuits. The low-temperature polysilicon layer is formed directly on the insulating substrate 101. Although the low-temperature polysilicon region 102 in the example of FIG. 3 is in contact with the insulating substrate 101, another insulating layer such as a silicon nitride layer can be provided therebetween.

The low-temperature polysilicon TFT 141 has a top-gate structure. The low-temperature polysilicon TFT 141 can have a bottom gate in addition to the top gate. The low-temperature polysilicon TFT 141 further includes a gate electrode region 107 and a gate insulating region located between the gate electrode region 107 and the channel region 103 in the layering direction. The gate insulating region is a part of an insulating layer 106 located between the gate electrode region 107 and the channel region 103. The insulating layer 106 includes the gate insulating regions of the other low-temperature polysilicon TFTs. The channel region 103, the gate insulating region, and the gate electrode region 107 are laid in this order from the bottom (the side closer to the insulating substrate 101); the gate insulating region is in contact with the channel region 103 and the gate electrode region 107.

The gate electrode region 107 is made of a conductor and included in a conductor layer. The gate electrode region 107 can be made of metal. The metal material can be selected desirably from Mo, W, Nb, and Al, for example. The insulating layer 106 in this example is made of silicon oxide.

An interlayer insulating film 108 is provided to cover the low-temperature polysilicon region 102, the gate insulating region, and the gate electrode region 107. The interlayer insulating film 108 can be a silicon nitride film. The source/drain electrode regions 109 and 110 are provided above the interlayer insulating film 108 and connected to the source/drain regions 104 and 105 via contact holes opened through the interlayer insulating film 108 and the insulating layer 106. The material for the source/drain electrode regions 109 and 110 can be Al or Ti, for example.

The storage capacitor 143 includes a lower electrode region 111, an upper electrode region 120 opposed to the lower electrode region 111, and an insulating region sandwiched between the lower electrode region 111 and the upper electrode region 120. The lower electrode region 111 is located above the interlayer insulating film 108 and continued from the source/drain electrode region 110. The lower electrode region 111 is included in the same conductor layer as the source/drain electrode regions 109 and 110.

Another interlayer insulating film 112 is laid above the interlayer insulating film 108. The interlayer insulating film 112 can be a silicon oxide film. The interlayer insulating film 112 is provided to cover the lower electrode region 111, the source/drain electrode regions 109 and 110, and the interlayer insulating film 108. The part of the interlayer insulating film 112 located between the lower electrode region 111 and the upper electrode region 120 corresponds to the insulating region.

The oxide semiconductor TFT 142 includes an oxide semiconductor region 113. The oxide semiconductor region 113 can be one oxide semiconductor film or a part of the oxide semiconductor film and includes source/drain regions 115 and 116 and a channel region 114 sandwiched between the source/drain regions 115 and 116 in an in-plane direction. The oxide semiconductor region 113 is also referred to as active layer of the oxide semiconductor TFT.

The source/drain regions 115 and 116 are made of IGZO reduced in resistance; they are connected to source/drain electrode regions 122 and 123. The channel region 114 is made of IGZO not reduced in resistance (highly resistive IGZO).

The oxide semiconductor region 113 is included in an oxide semiconductor layer. The oxide semiconductor layer includes the oxide semiconductor regions of a plurality of oxide semiconductor TFTs. The oxide semiconductor layer is provided above the interlayer insulating film 112.

The oxide semiconductor TFT 142 has a top-gate structure. The oxide semiconductor TFT 142 can have a bottom gate in addition to the top gate. The oxide semiconductor TFT 142 further includes a gate electrode region 119 and a gate insulating region located between the gate electrode region 119 and the channel region 114 in the layering direction. The gate insulating region is a part of an insulating layer 117 located between the gate electrode region 119 and the channel region 114.

The channel region 114, the gate insulating region, and the gate electrode region 119 are laid in this order from the bottom (the side closer to the insulating substrate 101); the gate insulating region is in contact with the channel region 114 and the gate electrode region 119. The gate electrode region 119 is made of a conductor and included in a conductor layer. The gate electrode region 119 can be made of metal. The metal material can be selected desirably from Mo, W, Nb, and Al, for example. The insulating layer 117 can be made of silicon oxide, for example.

Although FIG. 3 illustrates one low-temperature polysilicon TFT and one oxide semiconductor TFT, the other low-temperature polysilicon TFTs and oxide semiconductor TFTs in the pixel circuit have the same structures.

An interlayer insulating film 121 is provided to cover the oxide semiconductor region 113, the gate insulating region, and the gate electrode region 119 of the oxide semiconductor TFT 142 and the upper electrode region 120 of the storage capacitor 143. The interlayer insulating film 121 covers a part of the interlayer insulating film 112. The interlayer insulating film 121 can be a silicon oxide film.

The source/drain electrode regions 122 and 123 of the oxide semiconductor TFT 142 are provided above the interlayer insulating film 121. The source/drain electrode regions 122 and 123 are connected to the source/drain regions 115 and 116 of the oxide semiconductor TFT 142 via contact holes opened through the interlayer insulating film 121 and the insulating layer 117.

A connector region 129 continued from the source/drain electrode region 123 is connected to the upper electrode region 120 of the storage capacitor 143 via a contact hole opened through the interlayer insulating film 121 and the insulating layer 117 and further, connected to the gate electrode region 107 of the low-temperature polysilicon TFT 141 via a contact hole opened through the interlayer insulating films 121, 112, and 108 and the insulating layer 117.

The connector region 129 interconnects the source/drain electrode region 123, the upper electrode region 120, and the gate electrode region 107. The source/drain electrode regions 122 and 123 and the connector region 129 are included in a conductor layer. The material of the conductor layer is selected desirably; for example, Al or Ti can be employed.

An insulating planarization film 124 is laid to cover the exposed parts of the aforementioned conductor layer and the interlayer insulating film 121. The planarization film 124 can be made of an organic material. An anode electrode region 125 is provided above the planarization film 124. The anode electrode region 125 is connected to the source/drain electrode region 109 of the low-temperature polysilicon TFT 141 via a contact hole opened through the planarization film 124, the interlayer insulating films 121 and 112, and the insulating layer 117.

The anode electrode region 125 can include three layers of a transparent film of ITO or IZO, a reflective film of a metal such as Ag, Mg, Al, or Pt or an alloy containing such a metal, and another transparent film as mentioned above, for example. This three-layer structure of the anode electrode region 125 is merely an example; the anode electrode region 125 can have a two-layer structure.

Above the anode electrode region 125, an insulating pixel defining layer 126 is provided to isolate the OLED element 144. The pixel defining layer 126 can be made of an organic material. An organic light-emitting film 127 is provided above the anode electrode region 125. The organic light-emitting film 127 consists of, for example, a hole injection layer, a hole transport layer, a light-emitting layer, an electron transport layer, and an electron injection layer in this order from the bottom. The layered structure of the organic light-emitting film 127 is determined depending on the design.

Furthermore, a cathode electrode region 128 is provided above the organic light-emitting film 127. The cathode electrode region 128 of one OLED element 144 is a part of an unseparated conductor film. The cathode electrode region 128 transmits part of the visible light coming from the organic light-emitting film 127. The stack of the anode electrode region 125, the organic light-emitting film 127, and the cathode electrode region 128 provided within an opening of the pixel defining layer 126 corresponds to an OLED element 144.

Figure 4:
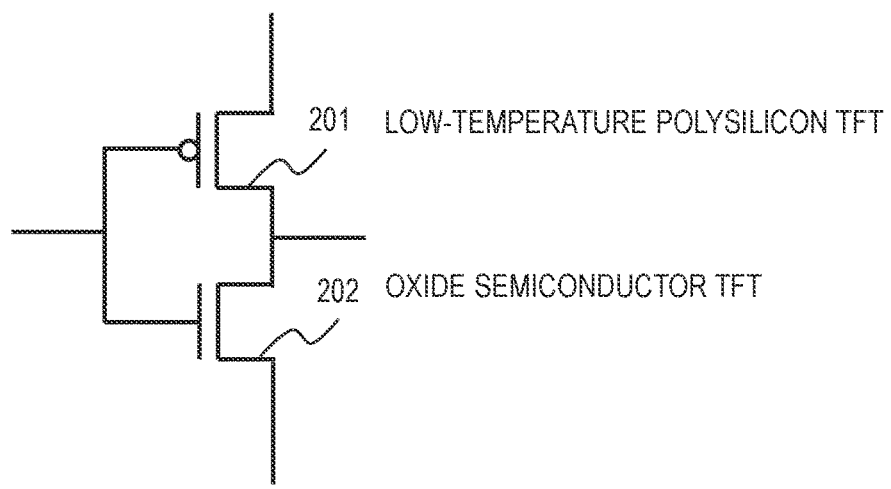
FIG. 4 illustrates an example of a CMOS circuit.

Next, a configuration of a complementary metal-oxide semiconductor (CMOS) circuit included in the driver circuit 31 or 32 on the TFT substrate is described. FIG. 4 illustrates an example of a CMOS circuit. The CMOS circuit includes a p-channel type of low-temperature polysilicon TFT 201 and an n-channel type of oxide semiconductor TFT 202. A source/drain of the low-temperature polysilicon TFT 201 is connected to a source/drain of the n-channel type of oxide semiconductor TFT 202. The gate of the low-temperature polysilicon TFT 201 and the gate of the oxide semiconductor TFT 202 are connected and they are supplied with the same signal.

Figure 5:
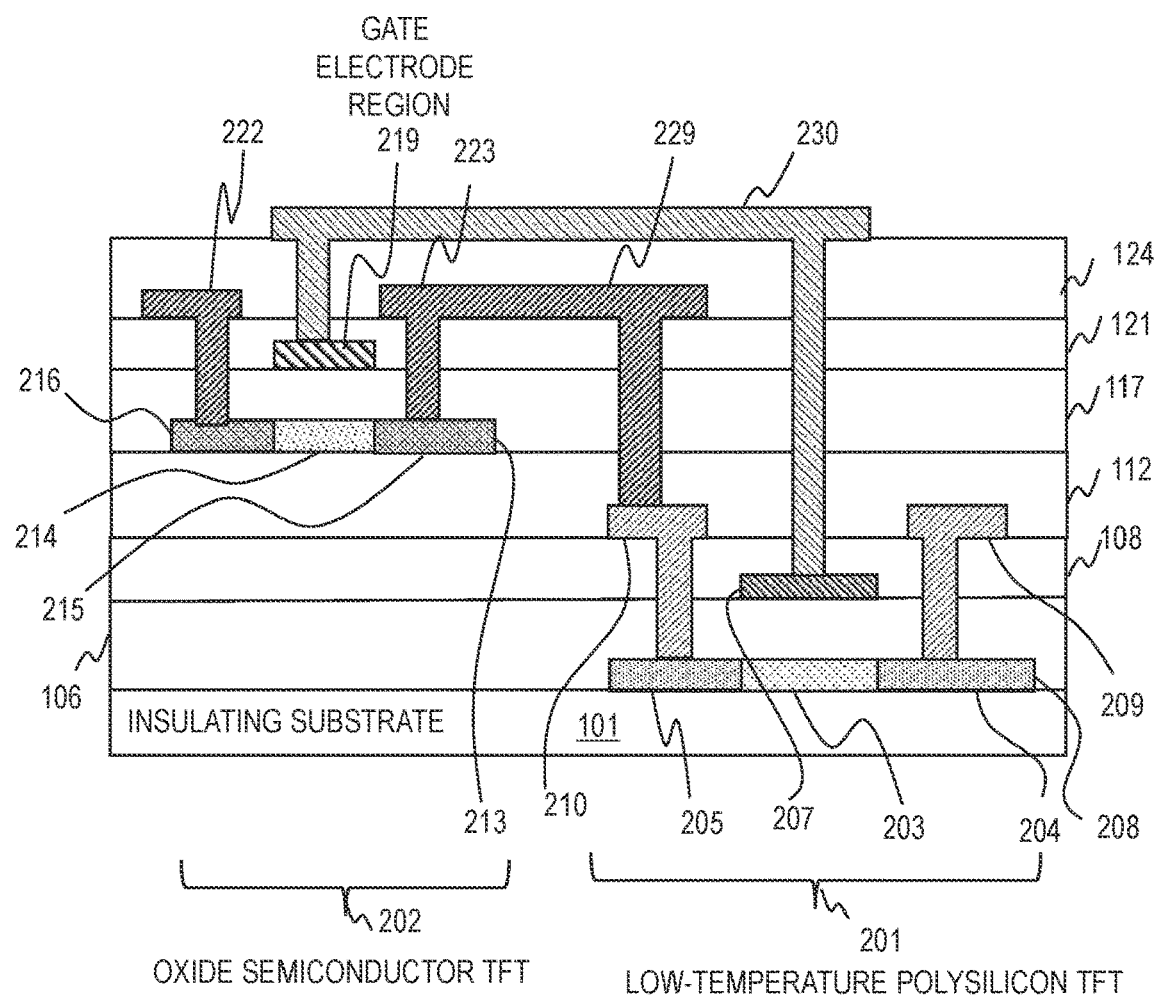
FIG. 5 schematically illustrates an example of the cross-sectional structure of the CMOS circuit illustrated in FIG. 4.

FIG. 5 schematically illustrates an example of the cross-sectional structure of the CMOS circuit illustrated in FIG. 4. Differences from the example of the cross-sectional structure illustrated in FIG. 3 are mainly described. In the structure example of FIG. 5, the storage capacitor 143 in the structure example of FIG. 3 is excluded. Moreover, the source/drain electrode region 210 of the low-temperature polysilicon TFT 201 and the source/drain electrode region 223 of the oxide semiconductor TFT 202 are connected and further, the gate electrode region 207 and the gate electrode region 219 are connected.

The low-temperature polysilicon TFT 201 in FIG. 5 can have the same configuration as the low-temperature polysilicon TFT 141 in FIG. 3. Their sizes can be different. The low-temperature polysilicon TFT 201 includes a low-temperature polysilicon region 208, a gate insulating region, and a gate electrode region 207. The gate insulating region is a part of an insulating layer 106 located between the gate electrode region 207 and the low-temperature polysilicon region 208.

The low-temperature polysilicon region 208 includes a channel region 203 and source/drain regions 204 and 205. The source/drain electrode regions 209 and 210 are connected to the source/drain regions 204 and 205 via contact holes opened through the interlayer insulating film 108 and the insulating layer 106.

The low-temperature polysilicon region 208, the gate insulating region, the gate electrode region 207, and the source/drain electrode regions 209 and 210 respectively correspond to the low-temperature polysilicon region 102, the gate insulating region, the gate electrode region 107, and the source/drain electrode regions 109 and 110 in FIG. 3. Each element is included in the same layer as the corresponding element.

The oxide semiconductor TFT 202 in FIG. 5 can have the same configuration as the oxide semiconductor TFT 142 in FIG. 3. Their sizes can be different. The oxide semiconductor TFT 202 includes an oxide semiconductor region 213, a gate insulating region, and a gate electrode region 219. The gate insulating region is a part of an insulating layer 117 located between the gate electrode region 219 and the oxide semiconductor region 213.

The oxide semiconductor region 213 includes a channel region 214 and source/drain regions 215 and 216. The oxide semiconductor region 213, the gate insulating region, and the gate electrode region 219 respectively correspond to the oxide semiconductor region 113, the gate insulating region, and the gate electrode region 119 in FIG. 3. Each element is included in the same layer as the corresponding element.

The connector region 229 is continued from the source/drain electrode region 223 of the oxide semiconductor TFT 202 and connected to the source/drain electrode region 210 of the low-temperature polysilicon TFT 201 via a contact hole opened through the interlayer insulating films 112 and 121 and the insulating layer 117. The connector region 230 is connected to the gate electrode region 219 of the oxide semiconductor TFT 202 via a contact hole opened through the interlayer insulating film 121 and the planarization film 124. The connector region 230 is also connected to the gate electrode region 207 of the low-temperature polysilicon TFT 201 via a contact hole opened through the interlayer insulating films 108, 112, and 121, the planarization film 124, and the insulating layer 117.

Configuration of Oxide Semiconductor TFT and Manufacturing Method

Figure 6A:
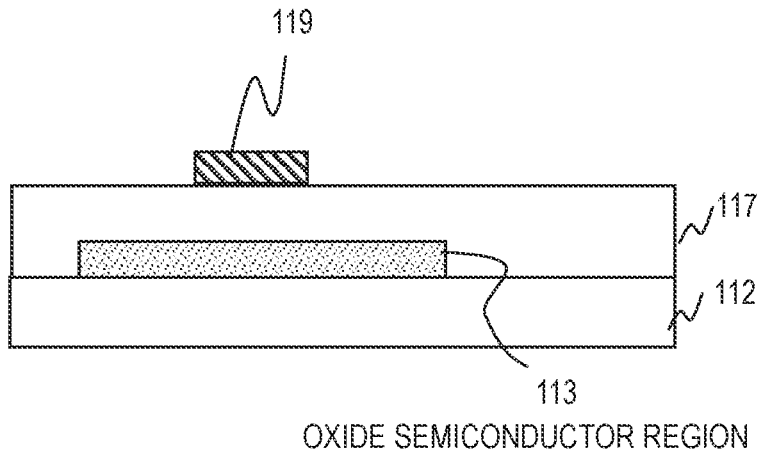
FIG. 6A illustrates some steps of a method of manufacturing an oxide semiconductor TFT.

Hereinafter, examples of the method of manufacturing an oxide semiconductor TFT are described. FIGS. 6A to 6D illustrate one method, which implants oxygen ions into the oxide semiconductor through an insulating layer. With reference to FIG. 6A, the manufacturing method produces an interlayer insulating film 112 by chemical vapor deposition (CVD) and then, produces an oxide semiconductor region 113. The oxide semiconductor region 113 can be produced by forming an oxide semiconductor layer by sputtering and etching the oxide semiconductor layer with a mask patterned by photolithography.

Next, the manufacturing method produces an insulating layer 117 by CVD and then, produces a gate electrode region 119 by forming a metal film by sputtering and etching the metal film with a mask patterned by photolithography.

Figure 6B:
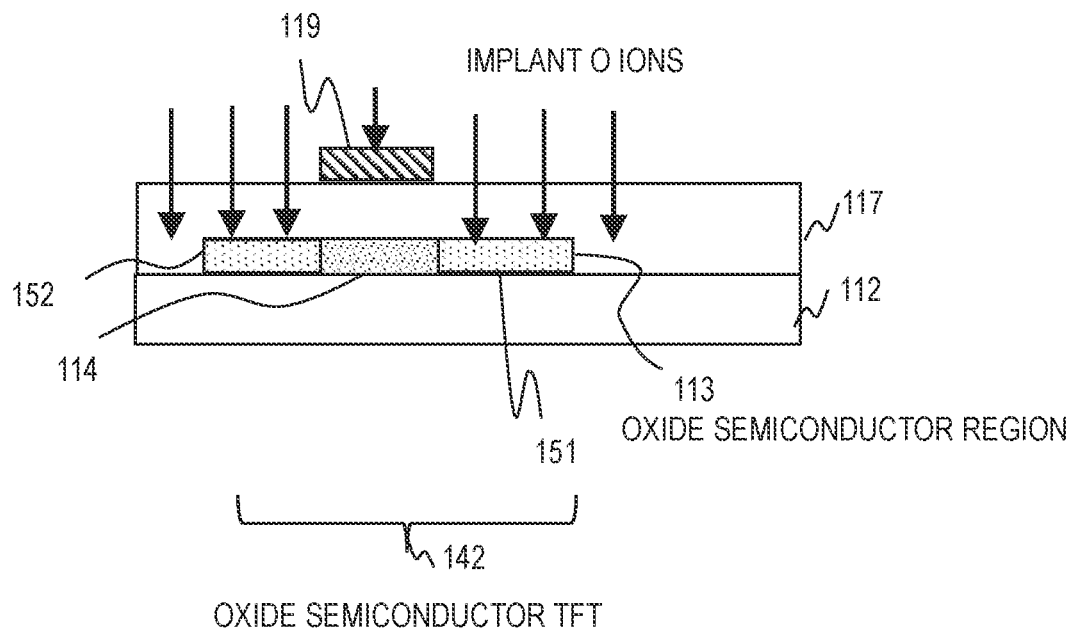
FIG. 6B illustrates some steps of a method of manufacturing an oxide semiconductor TFT.

With reference to FIG. 6B, the manufacturing method implants oxygen ions into the oxide semiconductor region 113 through the insulating layer 117. An embodiment of this specification introduces oxygen as a substance for compensating for oxygen vacancies in advance to the regions 151 and 152 to become source/drain regions in the oxide semiconductor region 113.

Figure 6C:
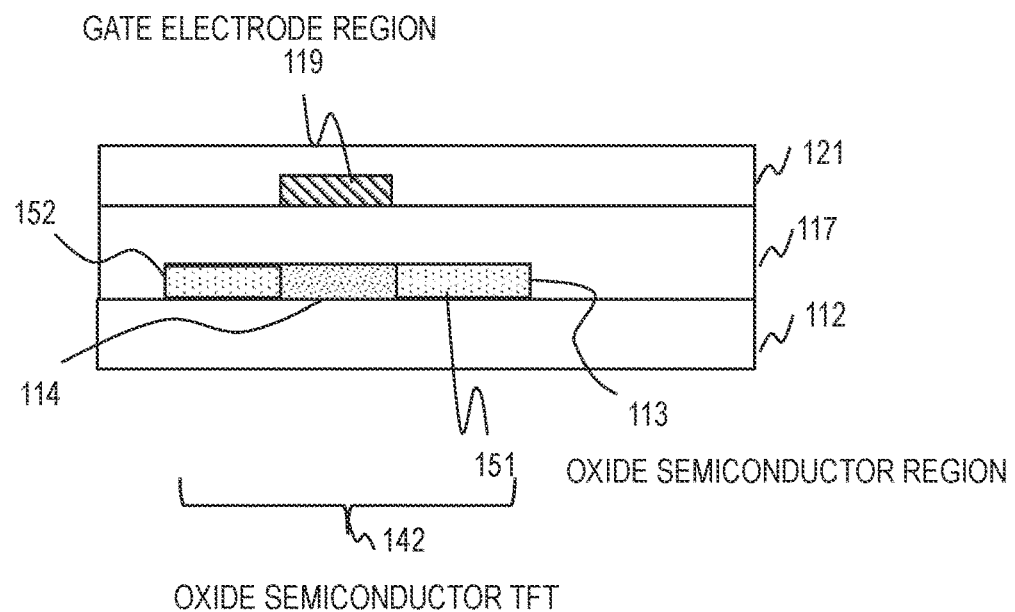
FIG. 6C illustrates some steps of a method of manufacturing an oxide semiconductor TFT.

With reference to FIG. 6C, the manufacturing method produces an interlayer insulating film 121 to cover the gate electrode region 119 and the insulating layer 117. The interlayer insulating film 121 can be produced by CVD.

Figure 6D:
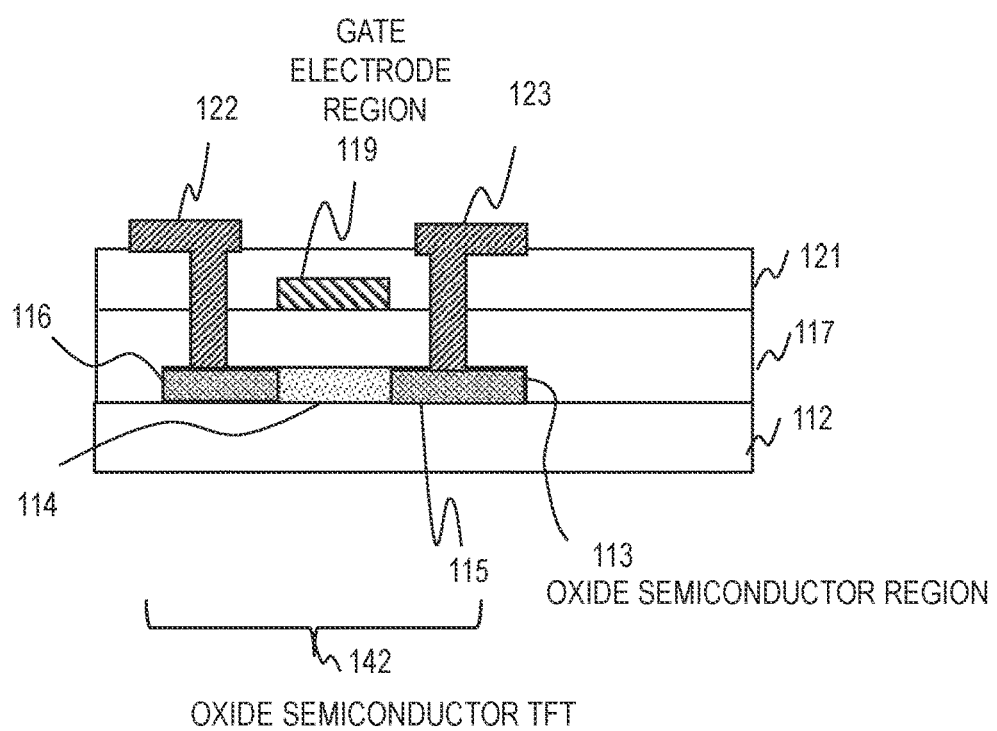
FIG. 6D illustrates some steps of a method of manufacturing an oxide semiconductor TFT.

With reference to FIG. 6D, the manufacturing method opens contact holes in the interlayer insulating film 121 and the insulating layer 117 by etching with a mask patterned by photolithography. Further, the manufacturing method deposits a metal film by sputtering and forms source/drain electrode regions 122 and 123 by etching the metal film with a mask patterned by photolithography. Thereafter, annealing is performed.

Oxygen vacancies are generated in the regions 151 and 152 containing implanted oxygen because of contact with the metal source/drain electrode regions 122 and 123. Specifically, the source/drain electrode regions 122 and 123 extract oxygen from the oxide semiconductor to increase oxygen vacancies in the oxide semiconductor. The oxygen vacancies expand from the interfaces with the source/drain electrode regions 122 and 123 toward the channel region 114. The oxygen vacancies reduce the resistance of the regions 151 and 152 to generate low-resistive source/drain regions 151 and 152.

As described above, the regions 151 and 152 contain oxygen implanted in advance. The oxygen impedes expansion (generation) of the oxygen vacancies. For this reason, the oxygen vacancies are prevented from expanding excessively to the inside of the region (overlap region) overlapping the gate electrode region 119 in a planar view (when viewed in the layering direction). The overlap region in the above-described example is the channel region 114. Although the oxygen vacancies can be generated because of other factors such as hydrogen in an insulating layer, the implanted oxygen can also prevent excessive generation of such oxygen vacancies.

Figure 7:
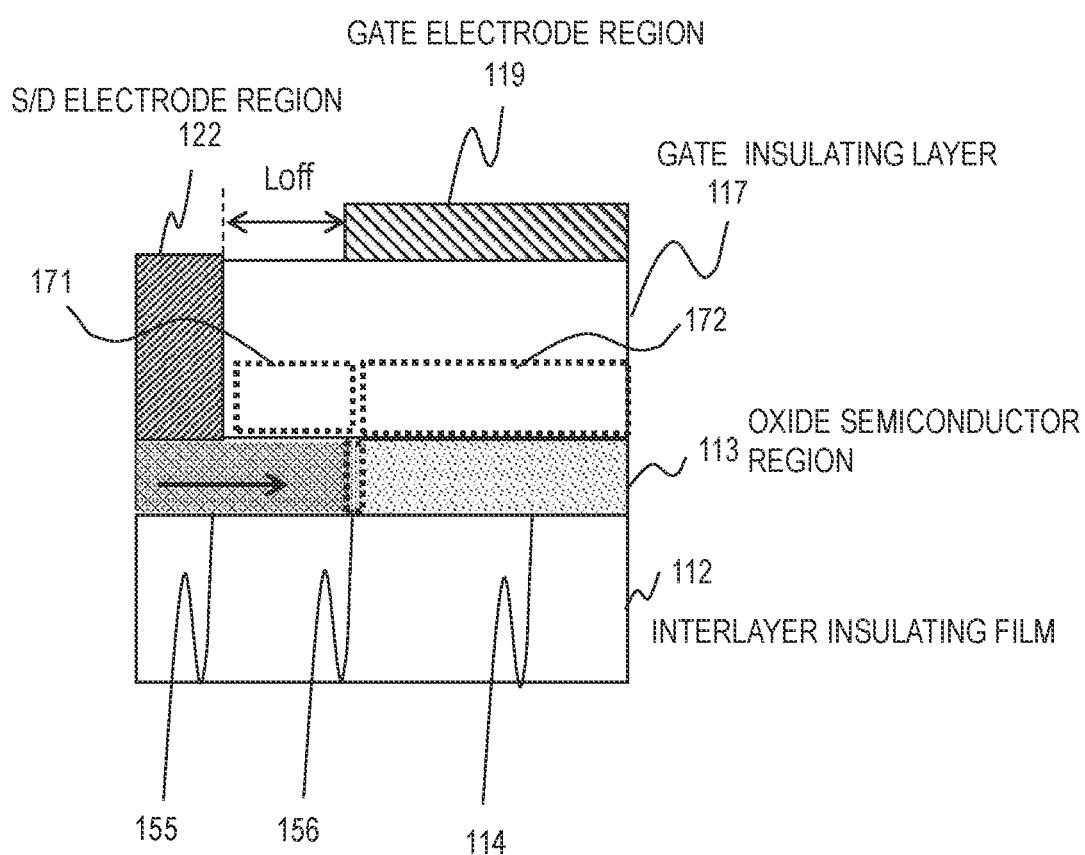
FIG. 7 schematically illustrates the oxygen concentration distribution in an oxide semiconductor region and a gate insulating layer.

FIG. 7 schematically illustrates the oxygen concentration distribution in a cross-section of the oxide semiconductor region 113 and the gate insulating layer 117. The accelerating voltage in implanting oxygen ions is controlled so that the highest concentration of the implanted oxygen in the direction of depth will be in the oxide semiconductor region 113.

Implanted oxygen ions exist in not only the oxide semiconductor region 113 but also the gate insulating layer 117. The oxygen ions are implanted using the gate electrode region 119 as a mask. For this reason, the oxygen concentration in the region 171 located outside the gate electrode region 119 in a planar view is higher than the oxygen concentration in the region 172 covered with the gate electrode region 119. The regions 171 and 172 are adjoining the oxide semiconductor region 113 thereunder. The regions 171 and 172 include vicinities of the oxide semiconductor region 113. In a planar view, the region 172 includes the centroid of the gate electrode region 119.

The region 171 is located between the source/drain (S/D) electrode region 122 and the gate electrode region 119; some of the oxygen ions pass through this region 171 to enter the oxide semiconductor region 113 and some oxygen ions stay in the region 171.

In the interlayer insulating film 112 under the oxide semiconductor region 113, an oxygen concentration distribution similar to the one in the gate insulating layer 117 can appear. Specifically, in the region of the interlayer insulating film 112 close to the oxide semiconductor region 113, the oxygen concentration in the part opposite to the region 171 is higher than the oxygen concentration in the part opposite to the region 172.

As described above, oxygen is extracted from the oxide semiconductor region 113 by the source/drain electrode regions 122 and 123 and oxygen vacancies increase from the channel region 114 toward the vicinities of the source/drain electrode regions 122 and 123. The amount of extracted oxygen is larger at the locations closer to the source/drain electrode regions 122 and 123.

In the example of FIG. 7, the region 155 is closer to the source/drain electrode region 122 than the region 156. The region 156 is located between the region 155 and the region (in this example, the channel region 114) covered with the gate electrode region 119. The oxygen concentration in the region 155 is lower than the oxygen concentration in the region 156. The oxygen concentration in the region 156 is higher than the oxygen concentration in the channel region 114. This configuration effectively hampers a low-resistive region from intruding into the channel region 114.

In a planar view, the region 156 is located outside the gate electrode region 119 and immediately before the proximal end of the gate electrode region 119 when seen from the source/drain electrode region 122. The channel length is defined in the horizontal direction in FIG. 7. In other words, the region 156 is an adjoining vicinity of one of the boundaries defining the channel length of the channel region 114.

An example of the oxygen concentration distribution in the oxide semiconductor region 113 shows the lowest concentration at the point coinciding with the centroid of the gate electrode region 119 in the planar view and the highest concentration at the point immediately next to the channel region 114 in the region 156. The description about the regions 155 and 156 is applicable to the opposite source/drain region.

As described above, implanting oxygen to outside the overlap region of the oxide semiconductor region 113 with the gate electrode region 119 effectively hampers the reduction of the resistance of the channel region 114 caused by expansion of oxygen vacancies. Then, an oxide semiconductor TFT having a short interval Loff between the gate electrode region 119 and either the source/drain electrode region 122 or 123 but having desired characteristics is attained, so that a TFT substrate having higher resolution and density becomes available.

The above-described example implants oxygen ions to the oxide semiconductor region 113 before forming the source/drain electrode regions 122 and 123. Another example can implant oxygen ions to the oxide semiconductor region 113 after forming the source/drain electrode regions 122 and 123.

Figure 8:
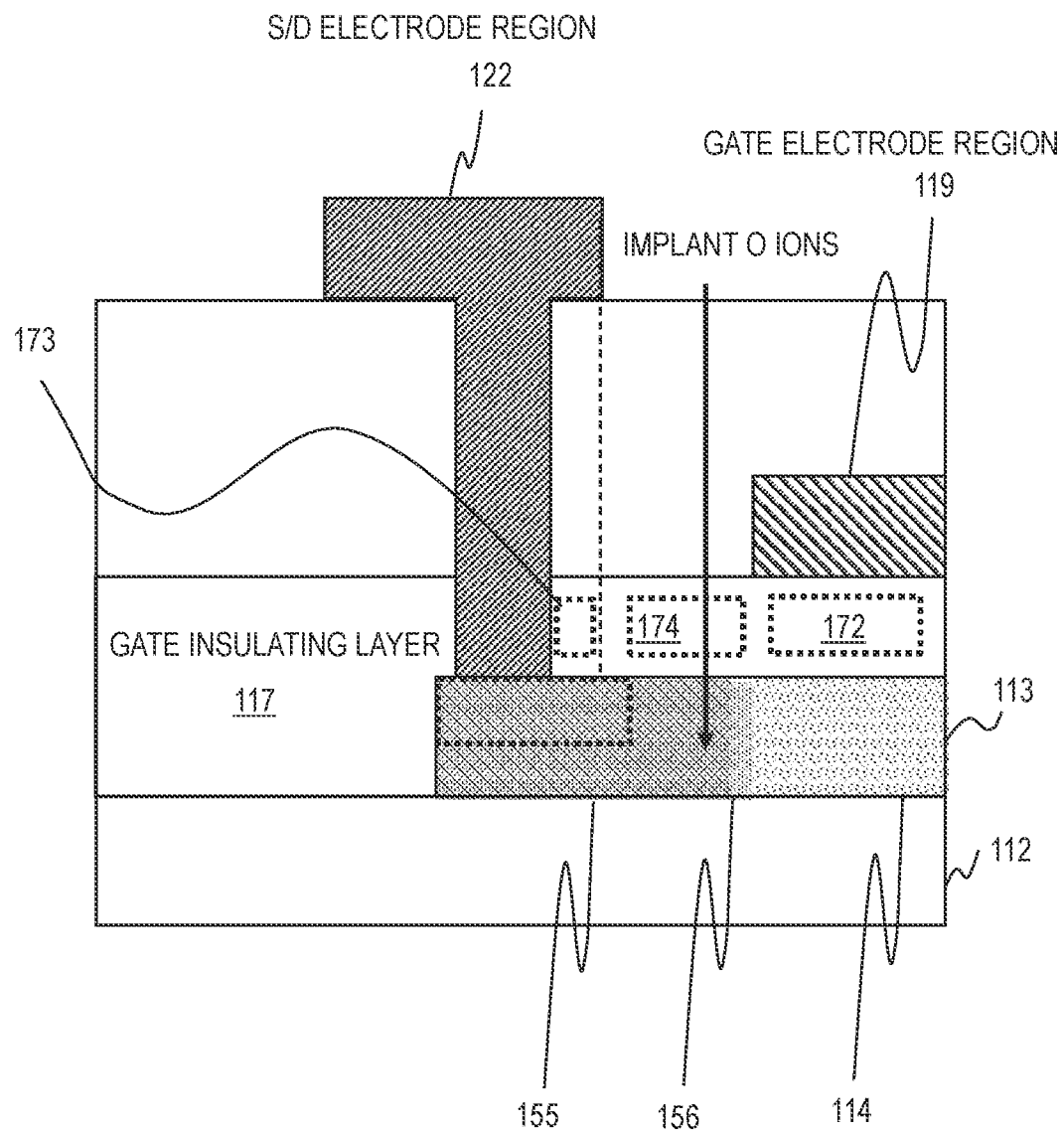
FIG. 8 illustrates an example of implanting oxygen ions to an oxide semiconductor region after forming source/drain electrode regions.

FIG. 8 illustrates such an example of implanting oxygen ions to the oxide semiconductor region 113 after forming the source/drain electrode regions 122 and 123. In the gate insulating layer 117, the oxygen concentration in the region 173 covered with a metal layer including the source/drain electrode regions 122 and 123 is substantially equal to the oxygen concentration in the region 172 under the gate electrode region 119. The oxygen concentration in the region 174 outside the gate electrode region 119 (the metal layer including the gate electrode region 119) and the metal layer including the source/drain electrode regions 122 and 123 is higher than the oxide concentration in the regions 172 and 173. The oxygen concentration in the oxide semiconductor region 113 is the same as described with reference to FIG. 7.

Next, another example of the method of manufacturing an oxide semiconductor TFT is described. FIGS. 9A to 9D illustrate another method, which partially removes an insulating layer by etching to form a gate insulating region and implants oxygen ions into the oxide semiconductor.

Figure 9A:
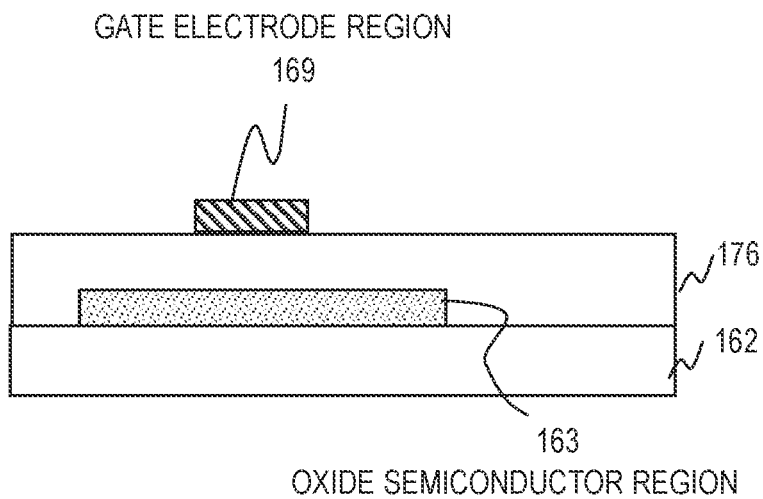
FIG. 9A illustrates some steps of another method of manufacturing an oxide semiconductor TFT.

With reference to FIG. 9A, this manufacturing method produces an interlayer insulating film 162 by CVD and then, produces an oxide semiconductor region 163. The oxide semiconductor region 163 can be produced by forming an oxide semiconductor layer by sputtering and etching the oxide semiconductor layer with a mask patterned by photolithography.

Next, the manufacturing method produces an insulating layer 176 by CVD and then, produces a gate electrode region 169 by forming a metal film by sputtering and etching the metal film with a mask patterned by photolithography.

Figure 9B:
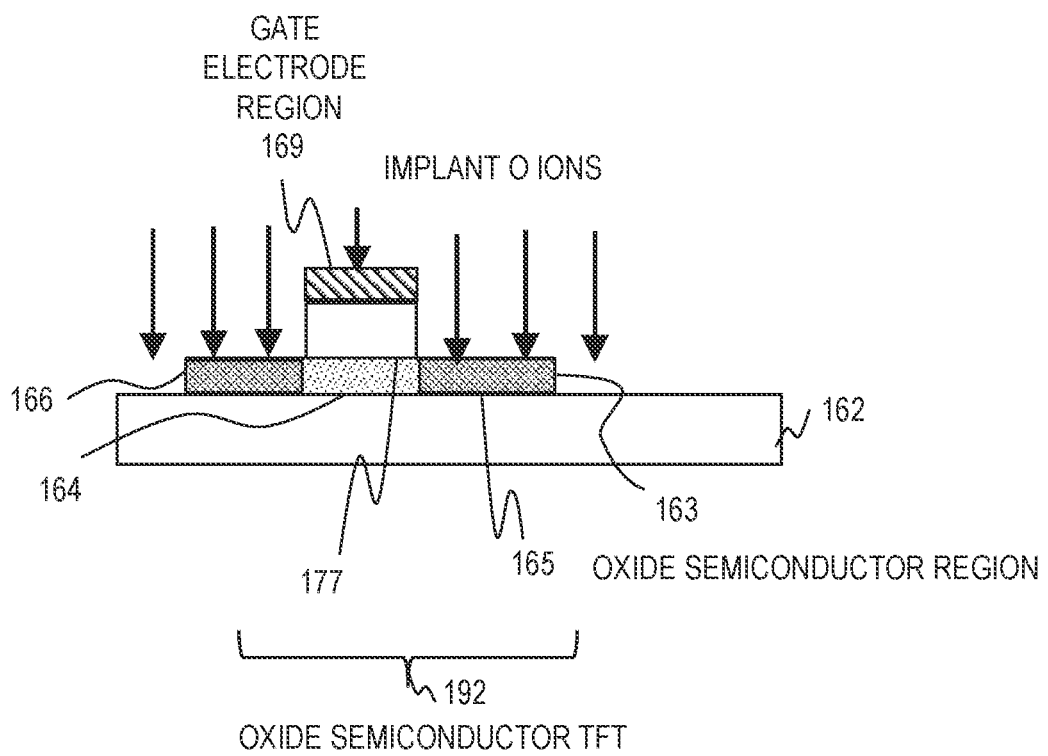
FIG. 9B illustrates some steps of another method of manufacturing an oxide semiconductor TFT.

With reference to FIG. 9B, the manufacturing method produces a gate insulating region 177 by etching the insulating layer 176 using the gate electrode region 169 as a mask. Through this process, the insulating layer 176 in the part uncovered with the gate electrode region 169 is removed and the oxide semiconductor region 163 thereunder is exposed.

Subsequently, the manufacturing method implants oxygen ions into the oxide semiconductor region 163. An embodiment of this specification introduces oxygen as a substance for compensating for oxygen vacancies in advance to the regions 165 and 166 to become source/drain regions in the oxide semiconductor region 163.

Figure 9C:
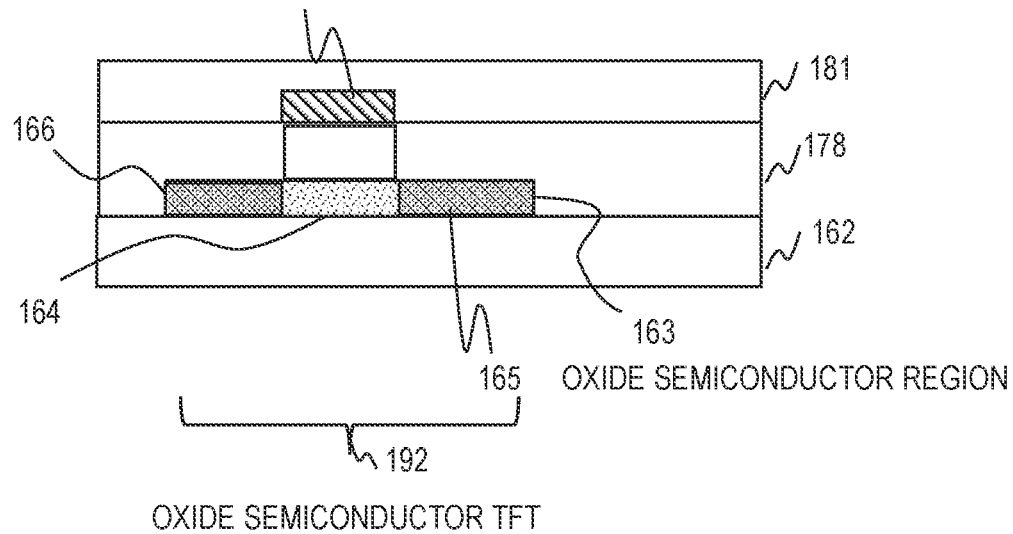
FIG. 9C illustrates some steps of another method of manufacturing an oxide semiconductor TFT.
Figure 9D:
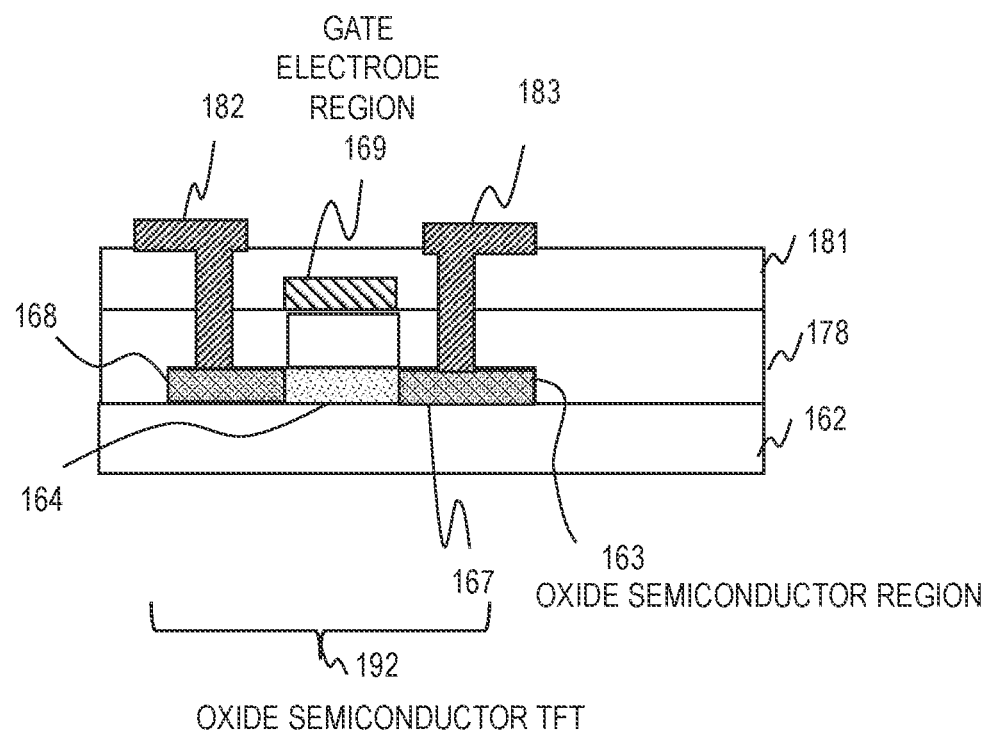
FIG. 9D illustrates some steps of another method of manufacturing an oxide semiconductor TFT.

With reference to FIG. 9C, the manufacturing method produces an interlayer insulating film 181 to cover the gate electrode region 169 and the insulating layer 178. The interlayer insulating film 181 can be produced by CVD. With reference to FIG. 9D, the manufacturing method opens contact holes in the interlayer insulating film 181 and the insulating layer 178 by etching with a mask patterned by photolithography. Further, the manufacturing method deposits a metal film by sputtering and forms source/drain electrode regions 182 and 183 by etching the metal film with a mask patterned by photolithography. Thereafter, annealing is performed.

Oxygen vacancies are generated in the regions 165 and 166 containing implanted oxygen because of contact with the metal source/drain electrode regions 182 and 183. Specifically, the source/drain electrode regions 182 and 183 extract oxygen from the oxide semiconductor to increase oxygen vacancies in the oxide semiconductor. The oxygen vacancies expand from the interfaces with the source/drain electrode regions 182 and 183 toward the channel region 164. The oxygen vacancies reduce the resistance of the regions 165 and 166 to generate low-resistive source/drain regions 167 and 168. Through the foregoing process, an oxide semiconductor TFT 192 is fabricated.

Figure 10:
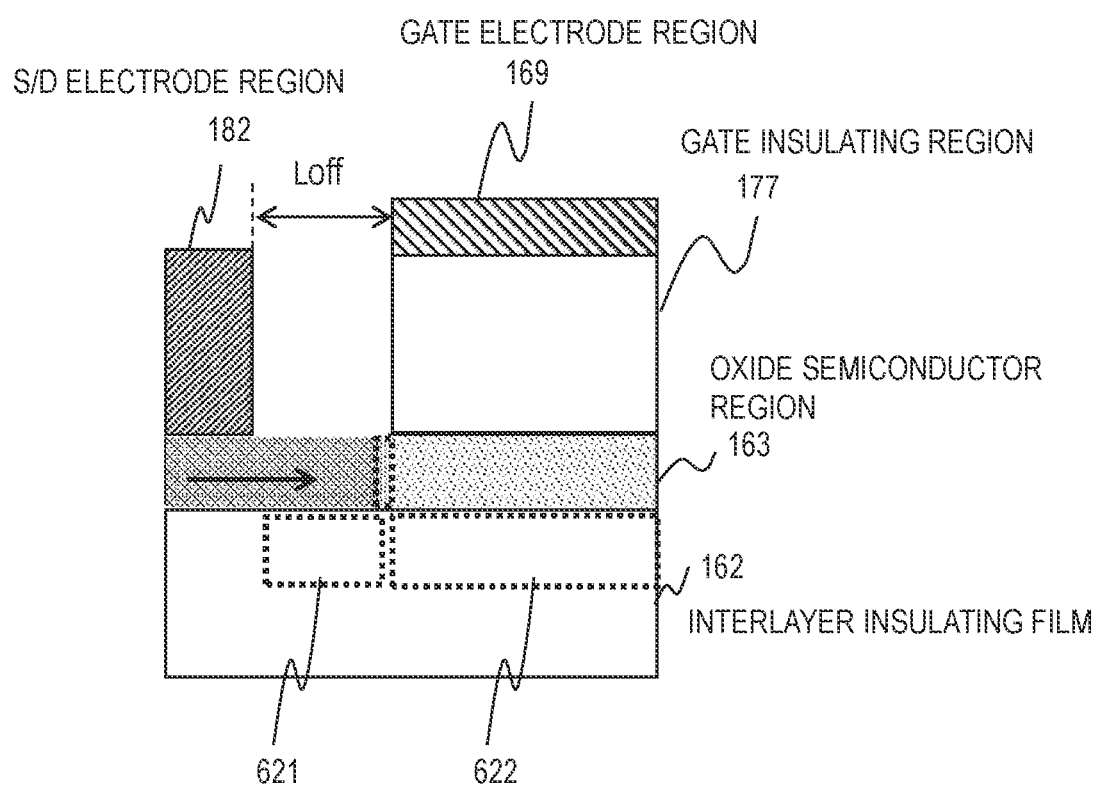
FIG. 10 schematically illustrates the oxygen concentration distribution in an interlayer insulating film produced by the method described with reference to FIGS. 9A to 9D.

FIG. 10 schematically illustrates the oxygen concentration distribution in the interlayer insulating layer 162 produced by the method described with reference to FIGS. 9A to 9D. Regarding the oxygen concentration distribution in the oxide semiconductor region 163, the description about the oxide semiconductor region 113 provided with reference to FIG. 7 is applicable. Oxygen ion implantation is controlled so that the highest concentration of the implanted oxygen will be in the oxide semiconductor region 163.

As described with reference to FIGS. 9A to 9D, oxygen ions are applied to an exposed oxide semiconductor region 163 using the gate electrode region 169 as a mask. For this reason, oxygen that passes through the oxide semiconductor region 163 is implanted into the interlayer insulating film 162 under the oxide semiconductor region 163.

The oxygen concentration in the region 621 outside the gate electrode region 169 in a planar view is higher than the oxygen concentration in the region 622 covered with the gate electrode region 169. The regions 621 and 622 are adjoining the oxide semiconductor region 163 thereabove. The regions 621 and 622 include vicinities of the oxide semiconductor region 163. In a planar view, the region 622 includes the centroid of the gate electrode region 169. The region 621 is located between the source/drain (S/D) electrode region 182 and the gate electrode region 169; some of the oxygen ions pass through the oxide semiconductor region 163 and enter this region.

Still another configuration example of an oxide semiconductor TFT and a method of manufacturing the oxide semiconductor TFT are described. In the configuration example described with reference to FIGS. 7 to 10, the intervals Loff from the gate electrode region to the source/drain electrode regions on both sides of the gate electrode region are equal. In another configuration example, one of the intervals can be longer than the other. If oxygen vacancies do not expand into the channel region because of the long interval Loff, oxygen ions do not need to be implanted to at least a part of the source/drain region providing the long interval Loff.

Figure 11A:
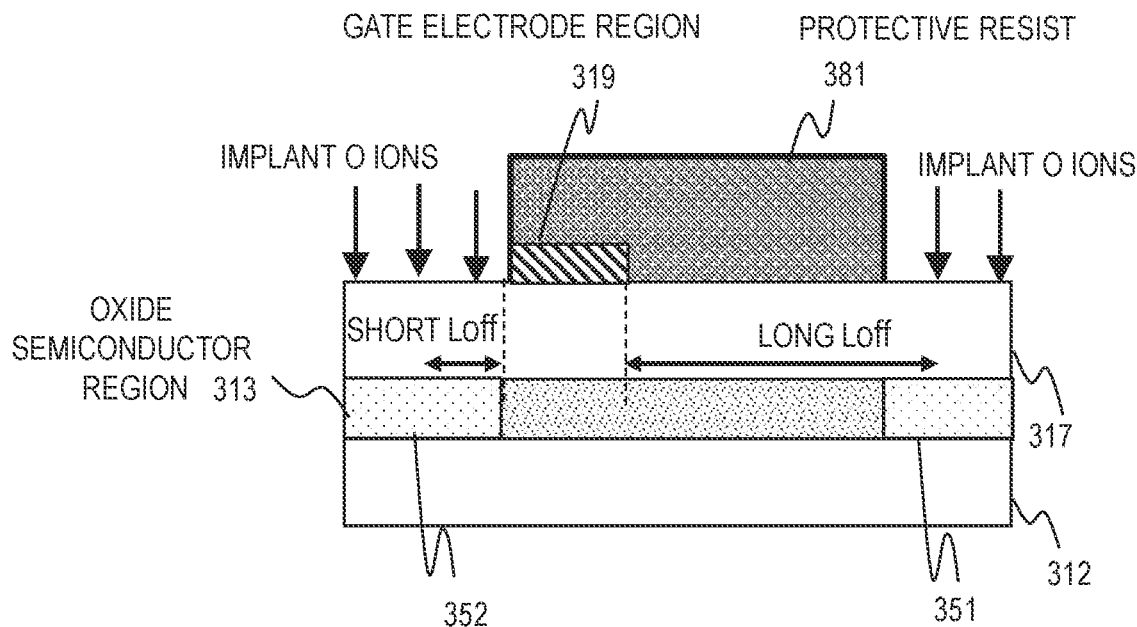
FIG. 11A illustrates some steps of still another method of manufacturing an oxide semiconductor TFT.

A method of manufacturing such an oxide semiconductor TFT is described with reference to FIGS. 11A to 11C. With reference to FIG. 11A, this manufacturing method produces an interlayer insulating film 312 by CVD and then, produces an oxide semiconductor region 313. The oxide semiconductor region 313 can be produced by forming an oxide semiconductor layer by sputtering and etching the oxide semiconductor layer with a mask patterned by photolithography.

Next, the manufacturing method produces an insulating layer 317 by CVD and then, produces a gate electrode region 319 by forming a metal film by sputtering and etching the metal film with a mask patterned by photolithography.

Further, the manufacturing method covers the whole gate electrode region 319 and a part of the source/drain region providing the long interval Loff with a protective resist 381. The manufacturing method applies oxygen ions to the region outside the protective resist 381. As a result, oxygen is implanted to the regions 352 and 351 of the oxide semiconductor region 313. The region 352 corresponds to the source/drain region providing the short interval Loff and the region 351 corresponds to a part of the source/drain region providing the long interval Loff. In a planar view, the region 352 is adjoining the gate electrode region 319. The region 351 is distant from the gate electrode region 319 in the planar view.

Figure 11B:
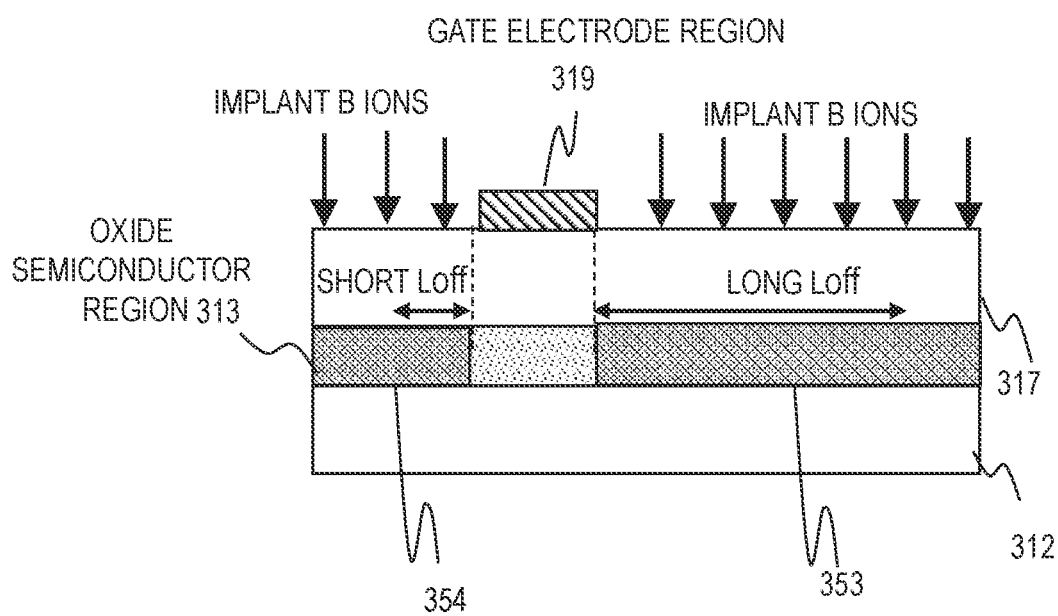
FIG. 11B illustrates some steps of still another method of manufacturing an oxide semiconductor TFT.

With reference to FIG. 11B, the manufacturing method removes the protective resist 381 and implants impurity ions to the oxide semiconductor region 313 across the insulating layer 317 using the gate electrode region 319 as a mask. Examples of the elements for the impurities include B, He, Ne, Ar, H, and P. The regions 353 and 354 of the oxide semiconductor region containing implanted impurity ions reduce in resistance.

Thereafter, the manufacturing method produces a not-shown interlayer insulating film to cover the gate electrode region 319 and the insulating layer 317 and opens contact holes in the not-shown interlayer insulating film and the insulating layer 317 by etching with a mask patterned by photolithography.

Figure 11C:
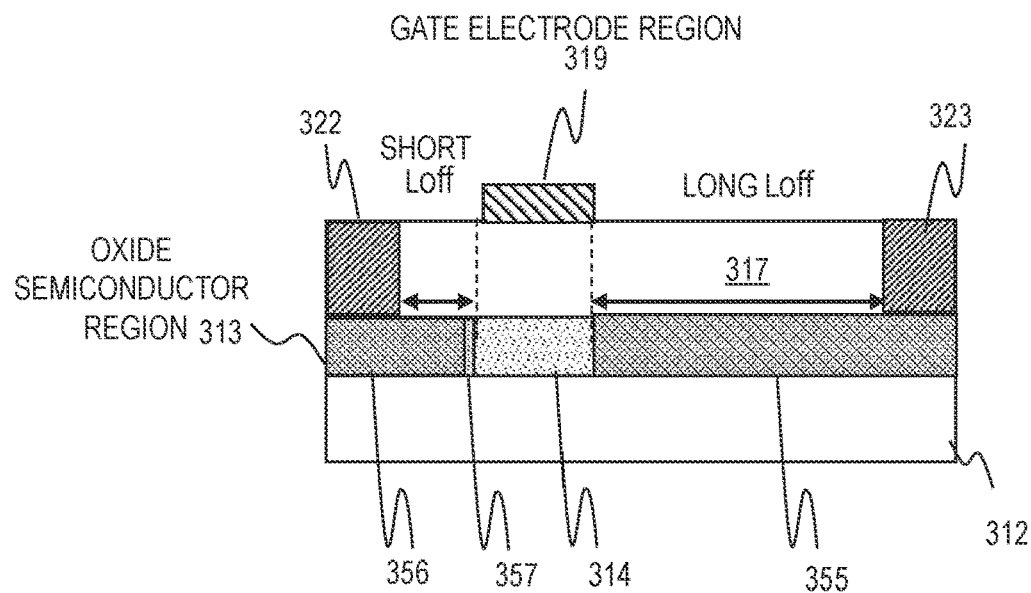
FIG. 11C illustrates some steps of still another method of manufacturing an oxide semiconductor TFT.

With reference to FIG. 11C, the manufacturing method deposits a metal film by sputtering and forms source/drain electrode regions 322 and 323 by etching the metal film with a mask patterned by photolithography. Thereafter, annealing is performed.

Oxygen vacancies are generated in the oxide semiconductor region 313 because of contact with source/drain electrode regions 322 and 323. As described in the foregoing other examples, regions 356 and 357 different in oxygen concentration are generated in the source/drain region providing the short interval Loff. The oxygen concentration in the region 357 adjoining the channel region 314 in a planar view is higher than the oxygen concentrations in the channel region 314 and the region 356. In the source/drain region 355 providing the long interval Loff, however, the region corresponding to the region 357 is not generated.

Regarding the oxygen concentration distribution in the regions containing implanted oxygen ions of the insulating layers 317 and 312 above and under the oxide semiconductor region 313, the description in the foregoing other examples is applicable.

Substance for Compensating for Oxygen Vacancies

The substance for compensating for oxygen vacancies is described. As oxygen ions to be implanted to compensate for oxygen vacancies, $^{16}O$ ions are selected among the isotopes of oxygen. Since $^{16}O$ is selectively implanted, the isotope ratio in the region containing implanted oxygen is different from the one in the natural world.

The proportions of the isotopes of oxygen existing in the natural world are as follows: 99.76% for $^{16}O$, 0.04% for $^{17}O$, and 0.21% for $^{18}O$. The region containing implanted $^{16}O$ attains a high abundance ratio of $^{16}O$, or low abundance ratios of $^{17}O$ and $^{18}O$, compared to the region not containing implanted oxygen.

Figure 12:
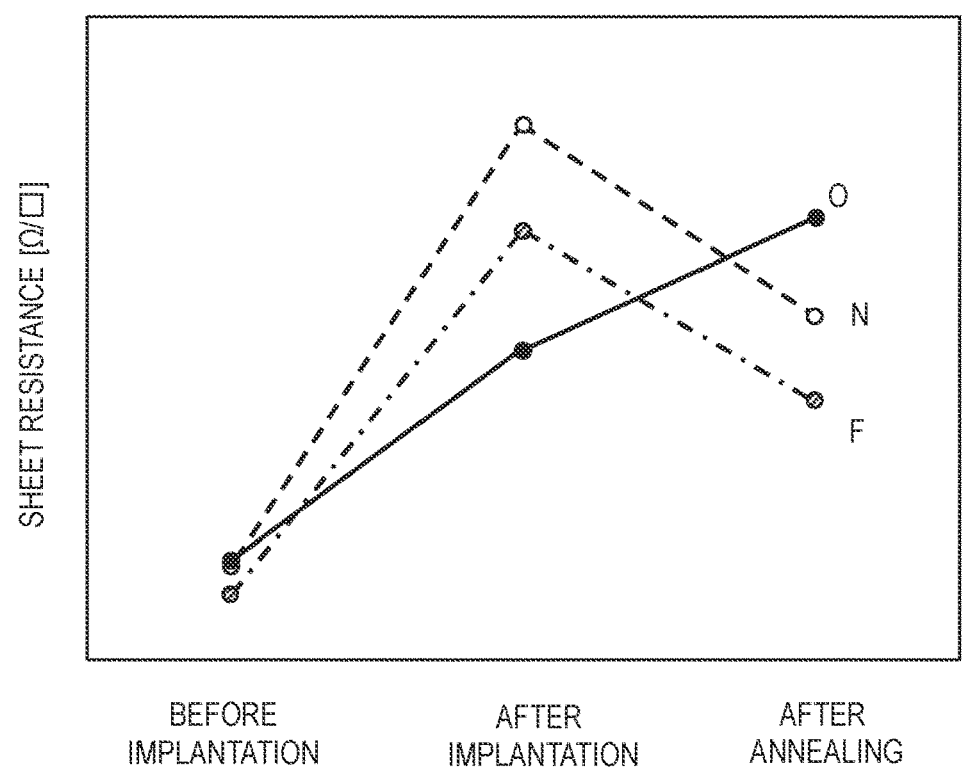
FIG. 12 illustrates results of an experiment where different kinds of ions are implanted to IGZO.

As a substance for compensating for oxygen vacancies, fluorine (F), nitrogen (N), or sulfur (S) can be used, other than oxygen (O). FIG. 12 illustrates results of an experiment where different kinds of ions are implanted to IGZO. The implanted ions were fluorine ions, nitride ions, and oxygen ions. The experiment produced single-layer IGZO films, implanted ions selected from these ions to the IGZO films, and annealed the IGZO films at 300° C. In the graph of FIG. 12, the horizontal axis represents the phases of before implantation, after implantation, and after annealing; the vertical axis represents the sheet resistance.

As indicated in FIG. 12, all of fluorine, nitrogen, and oxygen increase the resistance of the IGZO film by being implanted into the IGZO film. The resistances of the films with fluorine and nitrogen are higher than the resistance of the film with oxygen. Annealing increases the resistance of the film with oxygen more but reduces the resistance of the films with fluorine and nitrogen. However, even after the annealing, the resistances of the films with fluorine and nitrogen are higher than before implantation. As understood from FIG. 12, fluorine and nitrogen have effect of hampering an oxide semiconductor from reducing in resistance, like oxygen. Sulfur is an element homologous to oxygen and therefore, it exhibits the effect of compensating for oxygen vacancies, like oxygen.

In the case of implanting fluorine, nitrogen, or sulfur in place of oxygen, the implantation energy (eV) can be controlled so that the concentration profile of the element in the layering direction will have a peak in the oxide semiconductor.

Where to Implant Oxygen Ions

Hereinafter, other examples of the regions of an oxide semiconductor region where to implant oxygen ions are described. The foregoing examples implant oxygen ions to the source/drain regions. The following example implants oxygen ions to the channel region, more specifically, the vicinities of the boundary defining the width of the channel region (width's end regions). As a result, the hump characteristic of the oxide semiconductor TFT is moderated.

Figure 13:
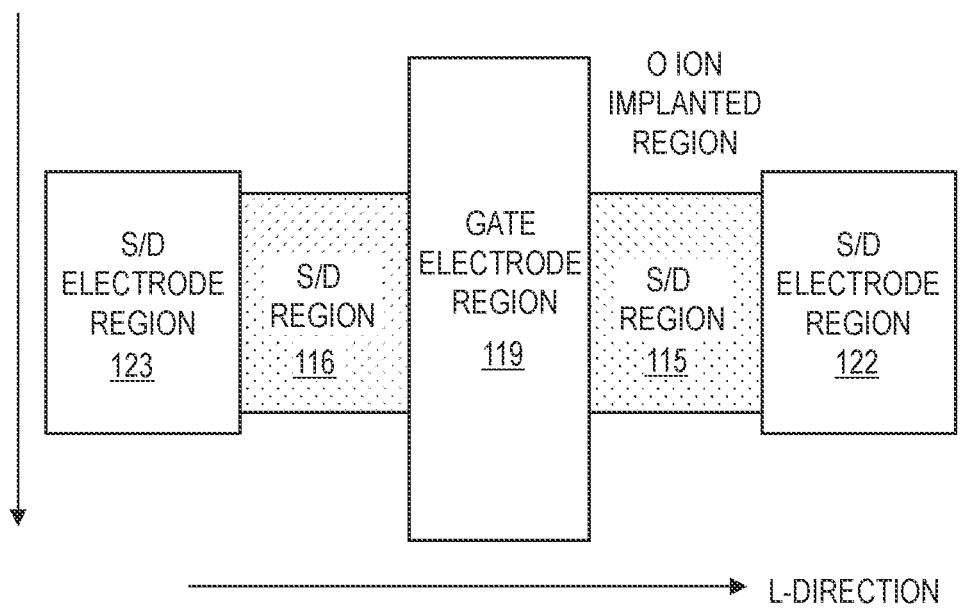
FIG. 13 is a plan diagram illustrating an example where oxygen ions are implanted to the source/drain regions.

FIG. 13 is a plan diagram illustrating an example where oxygen ions are implanted to the source/drain regions 115 and 116 as described with reference to FIGS. 6A to 7. The channel width is defined in the vertical direction (W-direction) in FIG. 13 and the channel length is defined in the horizontal direction (L-direction) in FIG. 13. The boundaries defining the channel length are the boundaries between a source/drain region and the channel region.

Figure 14:
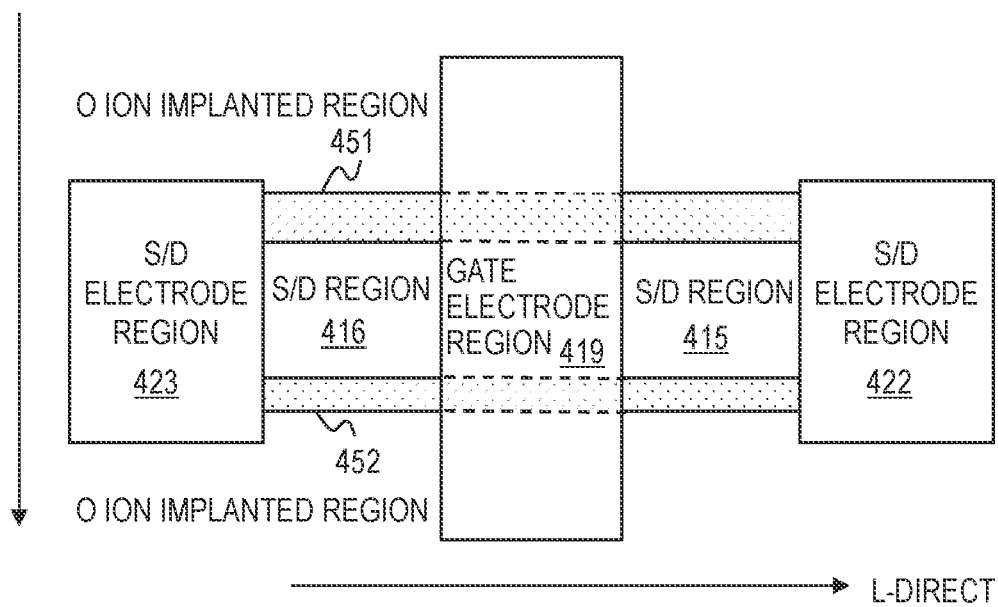
FIG. 14 is a plan diagram illustrating an example where oxygen ions are implanted to the width's end regions of the channel region.

FIG. 14 is a plan diagram illustrating an example where oxygen ions are implanted to the width's end regions of the channel region. In the example of FIG. 14, oxygen ions are also implanted to the width's end regions of the source/drain regions, in addition to the width's end regions of the channel region. In the configuration example of FIG. 14, a source/drain region 415 is located between a source/drain electrode region 422 and a gate electrode region 419 and a source/ drain region 416 is located between a source/drain electrode region 423 and the gate electrode region 419.

Oxygen ion implanted regions 451 and 452 are generated along the ends in the width direction (W-direction) of the oxide semiconductor region. The oxygen concentration in the regions 451 and 452 is higher than the oxygen concentration in the middle in the width direction (including the centroid of the gate electrode region) of the oxide semiconductor region. As described with reference to FIG. 12, the resistance of the oxide semiconductor is increased by oxygen ion implantation. In other words, the reduction of resistance in the width's end regions of the channel is hampered. As a result, the hump characteristic of the oxide semiconductor TFT is moderated.

Instead of oxygen, the other elements described with reference to FIG. 12 can be employed. Implanting oxygen ions to only one width's end region is not eliminated. Oxygen ions do not have to be implanted to the source/drain regions. Oxygen ions can be implanted to the source/drain regions as described with reference to FIGS. 6A to 11O, in addition to the width's end regions of the channel region.

Figure 15A:
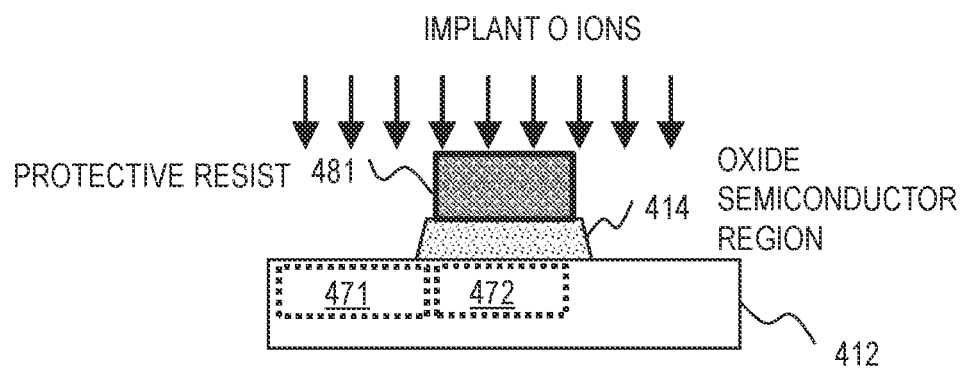
FIG. 15A illustrates an example of a method of implanting oxygen ions to the width's end regions of the channel region.

FIG. 15A is a cross-sectional diagram along the W-direction for illustrating an example of a method of implanting oxygen ions to the width's end regions of the channel region. The manufacturing method produces an oxide semiconductor region 414 after an interlayer insulating film 412. These can be produced as described with reference to FIG. 6A. The manufacturing method forms a protective resist 481 to cover the mid-region of the oxide semiconductor region 414 but expose the vicinities of the ends of the width (width's end regions). This step is performed before forming a metal layer including a gate electrode region. The manufacturing method implants oxygen ions using the protective resist 481 as a mask. Through this process, oxygen ions are implanted to the width's end regions in FIG. 14.

The interlayer insulating film 412 is located under and in direct contact with the oxide semiconductor region 414. Oxygen ions are implanted to a part of the interlayer insulating film 412. The oxygen concentration in the region 471 outside the oxide semiconductor region 414 in a planar view is higher than the oxygen concentration in the region 472 covered with the oxide semiconductor region 414. The oxygen in the interlayer insulating film 412 reduces the fixed charge in the interlayer insulating film 412 to impede the reduction in resistance of the channel width's end regions more strongly.

Figure 15B:
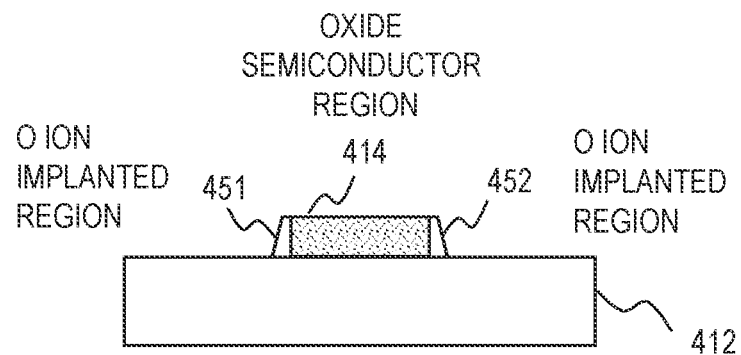
FIG. 15B schematically illustrates a configuration of an oxide semiconductor region after completion of manufacturing an oxide semiconductor TFT.

FIG. 15B is a cross-sectional diagram along the W-direction for schematically illustrating the configuration of the oxide semiconductor region 414 after completion of manufacturing an oxide semiconductor TFT. The oxide semiconductor region 414 has oxygen ion implanted regions 451 and 452 at the ends defining the channel width as described with reference to FIG. 14. Oxygen ions can be implanted to the vicinity of either one or both of the ends defining the channel length (channel length's ends) in the channel region.

The configuration examples of an oxide semiconductor TFT described with reference to FIGS. 3 to 15B include a top gate. The features in the embodiments of this specification can be applied to an oxide semiconductor TFT including a bottom-gate electrode in place of the top-gate electrode.

Figure 16:
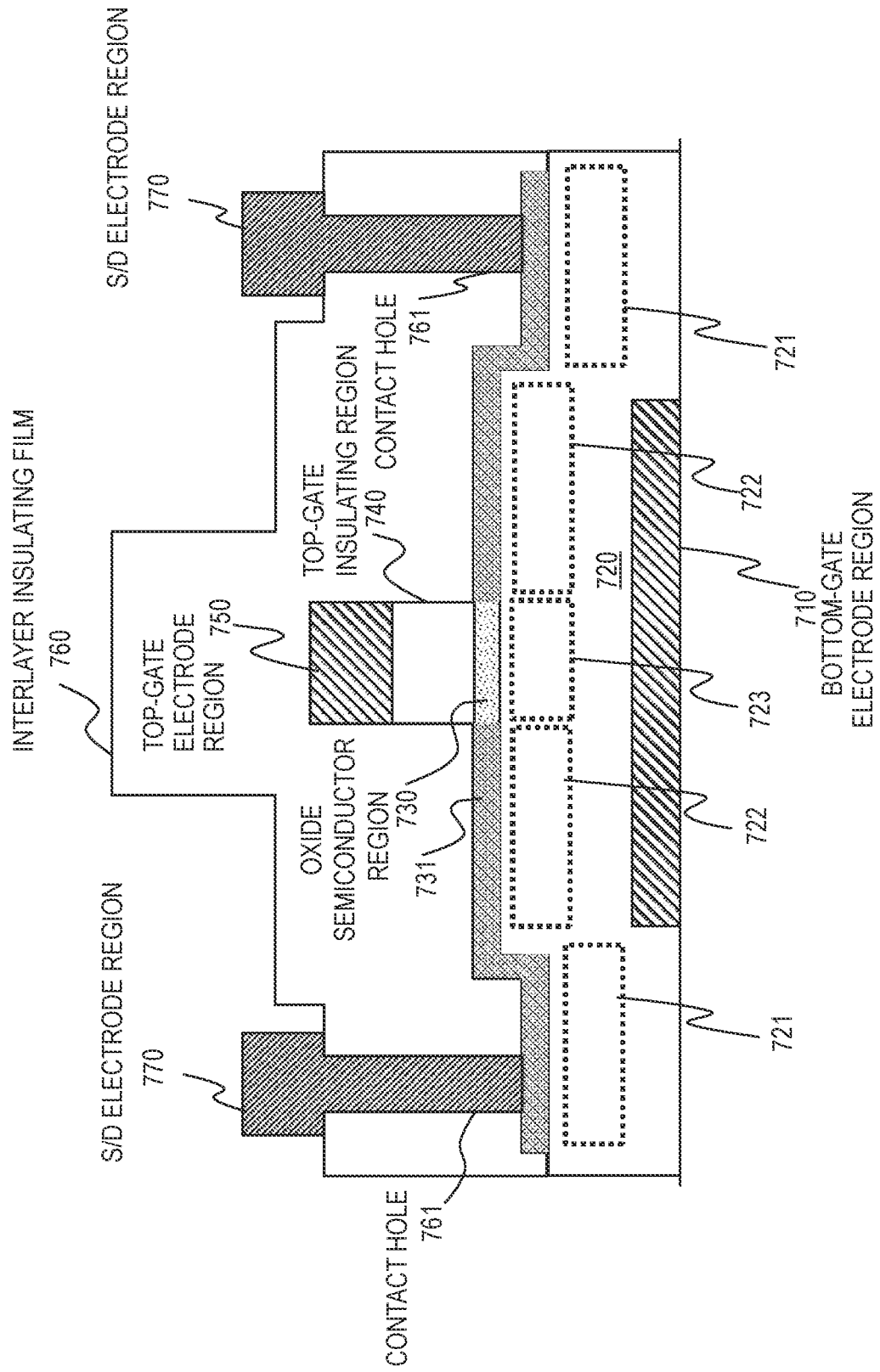
FIG. 16 illustrates a configuration example of a dual-gate TFT.

FIG. 16 illustrates a configuration example of a dual-gate TFT having a bottom-gate electrode region under the oxide semiconductor region, in addition to the top-gate electrode region above the oxide semiconductor region. A bottom-gate insulating region 720 is provided above a bottom-gate electrode region 710. Oxide semiconductor regions 730 and 731 are provided above the bottom-gate insulating region 720. The oxide semiconductor region 731 is reduced in resistance. A top-gate insulating region 740 is provided above the oxide semiconductor region 730 and a top-gate electrode region 750 is provided above the top-gate insulating region 740.

The top-gate electrode region 750 in an embodiment of this specification is a pattern (shape) having a shorter length in the channel length direction (horizontal direction in FIG. 16) than the bottom-gate electrode region 710. In a planar view, the both ends in the channel length direction (the right and the left ends in FIG. 16) of the top-gate electrode region 750 are located inner than the both ends in the channel length direction of the bottom-gate electrode region 710. An interlayer insulating film 760 is provided over the top-gate insulating region 740 and the oxide semiconductor region 731. Source/drain (S/D) electrode regions 770 are provided above the interlayer insulating film 760 and they are connected to the oxide semiconductor region 731 through contact holes 761 opened through the interlayer insulating film 760.

The oxide semiconductor TFT in FIG. 16 is an example where the top-gate insulating region 740 is formed by etching an insulating layer along the top-gate electrode region 750 and oxygen ions are introduced into the oxide semiconductor region 731 by ion implantation as illustrated in FIG. 9B to work as a substance for compensating for oxygen vacancies. Accordingly, the oxygen concentration in the regions 721 outside the bottom-gate electrode region 710 in a planar view are almost equal to the oxygen concentration in the regions 722 overlapping the bottom-gate electrode region 710 but not overlapping the top-gate electrode region 750 in the planar view and higher than the oxygen concentration in the region 723 overlapping both the bottom-gate electrode region 710 and the top-gate electrode region 750 in the planar view.

This configuration provides the same effect as the example of FIG. 9, which prevents the vicinities of the ends defining the channel length from reducing in resistance, and further, an effect of attaining high on-state current because both the top-gate electrode region 750 and the bottom-gate electrode region 710 apply gate fields.

Figure 17:
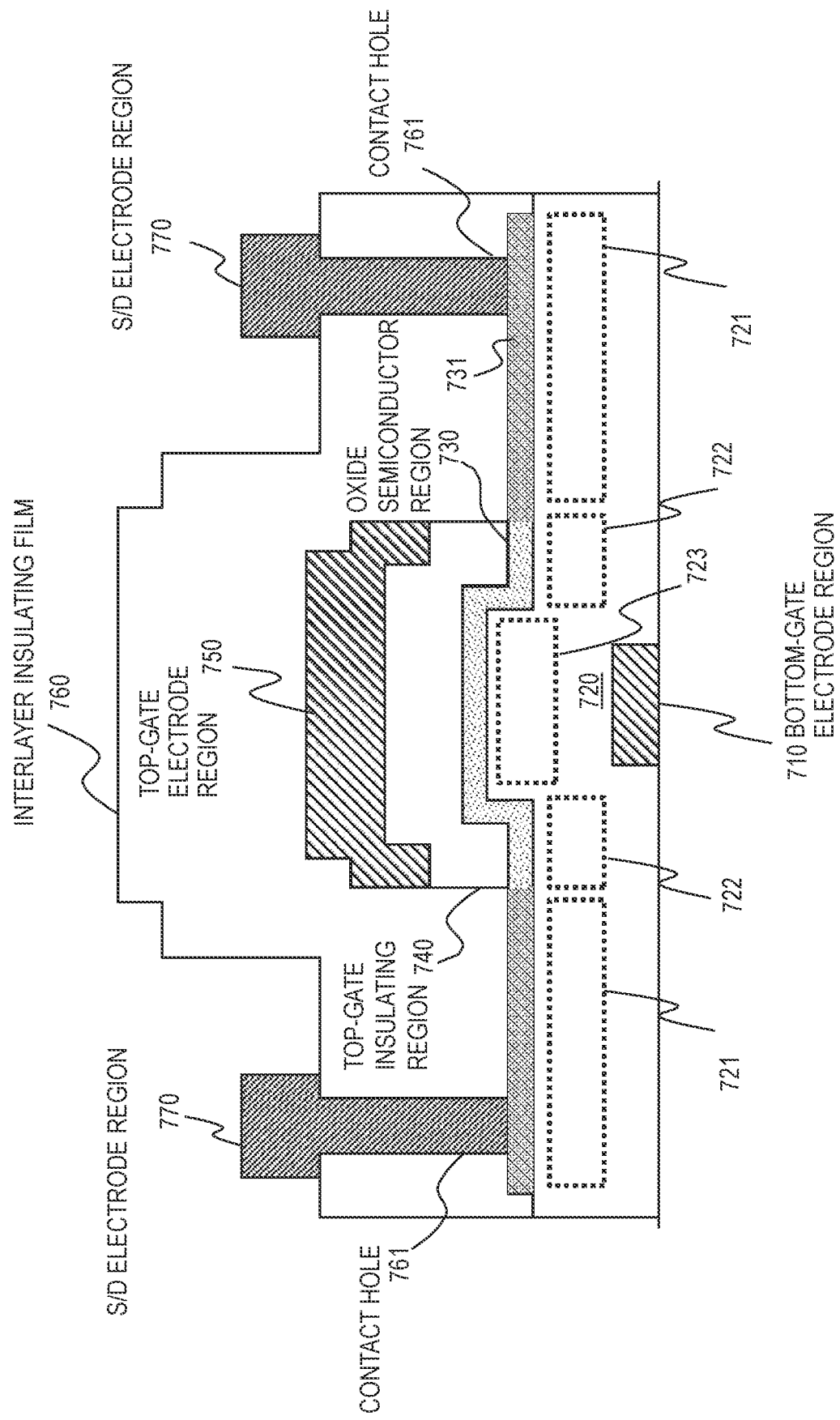
FIG. 17 illustrates another configuration example of a dual-gate TFT.

FIG. 17 illustrates another configuration example of a dual-gate TFT having a bottom-gate electrode region under the oxide semiconductor region, in addition to the top-gate electrode above the oxide semiconductor region. The difference from the dual-gate TFT in FIG. 16 is that the top-gate electrode region 750 is a pattern having a longer length in the channel length direction than the bottom-gate electrode region 710. The both ends in the channel length direction of the top-gate electrode region 750 are located outer than the bottom-gate electrode region 710.

The oxide semiconductor TFT in FIG. 17 is an example where the top-gate insulating region 740 is formed by etching an insulating layer along the top-gate electrode region 750 and oxygen ions are introduced into the oxide semiconductor region 731 by ion implantation as illustrated in FIG. 9B to work as a substance for compensating for oxygen vacancies. Accordingly, the oxygen concentration in the regions 721 outside both the bottom-gate electrode region 710 and the top-gate electrode region 750 in a planar view is higher than the oxygen concentration in the regions 722 overlapping the top-gate electrode region 750 outside the bottom gate electrode region 710 in the planar view and the region 723 overlapping both the bottom-gate electrode region 710 and the top-gate electrode region 750 in the planar view.

This configuration in FIG. 17 also provides the same effect as the configuration in FIG. 16, which prevents the vicinities of the ends defining the channel length from reducing in resistance, and further, an effect of attaining high on-state current because both the top-gate electrode region 750 and the bottom-gate electrode region 710 apply gate fields.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. An oxide semiconductor thin-film transistor device comprising:
    a gate electrode region;
    an oxide semiconductor region;
    a first source/drain electrode region; and
    a second source/drain electrode region,
    wherein the oxide semiconductor region has a concentration distribution of an element capable of increasing resistance of an oxide semiconductor,
    wherein the concentration distribution shows a first concentration at the centroid of a channel region overlapping the gate electrode region in a planar view,
    wherein the concentration distribution shows a concentration higher than the first concentration in a vicinity of at least a part of a boundary defining an outer end of the channel region,
    wherein the oxide semiconductor region includes a first source/drain region located outer than the boundary of the channel region and on a side of the first source/drain electrode region,
    wherein the concentration distribution in the first source/drain region shows a concentration higher than the first concentration in a vicinity of the boundary of the channel region,
    wherein the element is oxygen, and
    wherein the concentration distribution in the first source/drain region shows a higher concentration in a vicinity of the boundary of the channel region than in a region in contact with the first source/drain electrode region.

2. The oxide semiconductor thin-film transistor device according to claim 1,
    wherein the concentration distribution in the channel region shows a concentration higher than the first concentration in vicinities of ends defining a channel width.

3. The oxide semiconductor thin-film transistor device according to claim 1, further comprising:
    a gate insulating layer between the gate electrode region and the oxide semiconductor region,
    wherein, in the gate insulating layer, an oxygen concentration in a region outside the gate electrode region in a planar view is higher than an oxygen concentration in a region overlapping the gate electrode region in the planar view.

4. An oxide semiconductor thin-film transistor device comprising:
    a gate electrode region;
    an oxide semiconductor region;
    a first source/drain electrode region; and
    a second source/drain electrode region,
    wherein the oxide semiconductor region has a concentration distribution of an element capable of increasing resistance of an oxide semiconductor,
    wherein the concentration distribution shows a first concentration at the centroid of a channel region overlapping the gate electrode region in a planar view,
    wherein the concentration distribution shows a concentration higher than the first concentration in a vicinity of at least a part of a boundary defining an outer end of the channel region,
    wherein the gate electrode region is a top-gate electrode region located upper than the oxide semiconductor region,
    wherein the oxide semiconductor thin-film transistor device further comprises:
        an insulating layer under the oxide semiconductor region; and
        a bottom-gate electrode region under the insulating layer, the bottom-gate electrode region being a pattern longer in length in a direction along a channel length than the top-gate electrode region, and
    wherein, in the insulating layer, a concentration of the element capable of increasing resistance of an oxide semiconductor in a region outside the bottom-gate electrode region in a planar view is equal to a concentration of the element capable of increasing resistance of an oxide semiconductor, in a region overlapping the bottom-gate electrode region but not overlapping the top-gate electrode region in the planar view and higher than a concentration of the element capable of increasing resistance of an oxide semiconductor in a region overlapping both the bottom-gate electrode region and the top-gate electrode region in the planar view.

5. The oxide semiconductor thin-film transistor device according to claim 4, wherein the element is an element selected from a group consisting of oxygen, fluorine, nitrogen, and sulfur.

6. An oxide semiconductor thin-film transistor device comprising:
    a gate electrode region;
    an oxide semiconductor region;
    a first source/drain electrode region; and
    a second source/drain electrode region,
    wherein the oxide semiconductor region has a concentration distribution of an element capable of increasing resistance of an oxide semiconductor,
    wherein the concentration distribution shows a first concentration at the centroid of a channel region overlapping the gate electrode region in a planar view,
    wherein the concentration distribution shows a concentration higher than the first concentration in a vicinity of at least a part of a boundary defining an outer end of the channel region,
    wherein the gate electrode region is a top-gate electrode region located upper than the oxide semiconductor region,
    wherein the oxide semiconductor thin-film transistor device further comprises:
        an insulating layer under the oxide semiconductor region; and
        a bottom-gate electrode region under the insulating layer, the bottom-gate electrode region being a pattern shorter in length in a direction along a channel length than the top-gate electrode region, and
    wherein, in the insulating layer, a concentration of the element capable of increasing resistance of an oxide semiconductor in a region outside both the bottom-gate electrode region and the top-gate electrode region in a planar view is higher than a concentration of the element capable of increasing resistance of an oxide semiconductor in a region not overlapping the bottom-gate electrode region but overlapping the top-gate electrode region in the planar view and a concentration of the element capable of increasing resistance of an oxide semiconductor in a region overlapping both the bottom-gate electrode region and the top-gate electrode region in the planar view.

7. The oxide semiconductor thin-film transistor device according to claim 6, wherein the element is an element selected from a group consisting of oxygen, fluorine, nitrogen, and sulfur.

* * * * *